(12) United States Patent
Sung et al.

(10) Patent No.: US 8,330,352 B2
(45) Date of Patent: Dec. 11, 2012

(54) ORGANIC LIGHT EMITTING DIODE DISPLAY AND METHOD FOR MANUFACTURING THE SAME

(75) Inventors: Un-Cheol Sung, Anyang-si (KR);
Beohm-Rock Choi, Seoul (KR);
Jung-Soo Rhee, Seoul (KR);
Young-Rok Song, Yongin-si (KR);
Ji-Hye Choi, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 1094 days.

(21) Appl. No.: 12/250,225

(22) Filed: Oct. 13, 2008

(65) Prior Publication Data

US 2009/0121983 A1  May 14, 2009

(30) Foreign Application Priority Data

Nov. 13, 2007 (KR) .................. 10-2007-0115384
Apr. 17, 2008 (KR) .................. 10-2008-0035774

(51) Int. Cl.
*H01J 1/62* (2006.01)
*H01J 63/04* (2006.01)

(52) U.S. Cl. .................. 313/504; 313/505; 313/506

(58) Field of Classification Search .............. 313/504, 313/506
See application file for complete search history.

(56) References Cited

U.S. PATENT DOCUMENTS

| | | | |
|---|---|---|---|
| 5,341,153 A * | 8/1994 | Benzschawel et al. | 345/694 |
| 6,008,868 A * | 12/1999 | Silverbrook | 348/790 |
| 6,366,025 B1 * | 4/2002 | Yamada | 315/169.3 |
| 6,429,601 B1 * | 8/2002 | Friend et al. | 315/169.3 |
| 6,747,618 B2 * | 6/2004 | Arnold et al. | 345/77 |
| 6,801,000 B2 * | 10/2004 | Jongman et al. | 315/169.1 |
| 6,838,819 B2 * | 1/2005 | Kim et al. | 313/505 |
| 6,867,549 B2 * | 3/2005 | Cok et al. | 315/169.3 |
| 6,870,323 B1 * | 3/2005 | Cok | 315/169.3 |
| 6,903,754 B2 * | 6/2005 | Brown Elliott | 345/694 |
| 6,919,681 B2 * | 7/2005 | Cok et al. | 313/500 |
| 6,940,222 B2 * | 9/2005 | Sakurai | 313/500 |
| 7,205,713 B2 * | 4/2007 | Kiguchi | 313/504 |
| 7,239,363 B2 * | 7/2007 | Park et al. | 349/109 |
| 7,492,337 B2 * | 2/2009 | Fukase | 345/76 |
| 7,508,126 B2 * | 3/2009 | Miyagawa | 313/504 |
| 7,728,802 B2 * | 6/2010 | Brown Elliott | 345/88 |
| 7,791,565 B2 * | 9/2010 | Fish et al. | 345/76 |
| 7,821,553 B2 * | 10/2010 | Ellis-Monaghan et al. | 348/277 |
| 7,825,584 B2 * | 11/2010 | Kim | 313/504 |
| 8,013,817 B2 * | 9/2011 | Miller et al. | 345/83 |
| 8,247,966 B2 * | 8/2012 | Lee et al. | 313/506 |
| 2002/0014837 A1 * | 2/2002 | Kim et al. | 313/505 |
| 2002/0015110 A1 * | 2/2002 | Brown Elliott | 348/589 |
| 2003/0052597 A1 * | 3/2003 | Sakurai | 313/504 |
| 2004/0036421 A1 * | 2/2004 | Arnold et al. | 315/169.3 |
| 2004/0108818 A1 * | 6/2004 | Cok et al. | 315/169.3 |
| 2004/0125278 A1 * | 7/2004 | Park et al. | 349/106 |

(Continued)

*Primary Examiner* — Nimeshkumar Patel
*Assistant Examiner* — Thomas A Hollweg
(74) *Attorney, Agent, or Firm* — H.C. Park & Associates, PLC

(57) ABSTRACT

An organic light emitting device according to an exemplary embodiment of the present invention includes a plurality of first, second, and third pixels for displaying different colors, wherein the plurality of first and second pixels are alternately arranged in a first column, the plurality of third pixels are continuously arranged in a second column, and an interval between the third pixels is larger than an interval between the first pixel and the second pixel.

20 Claims, 25 Drawing Sheets

U.S. PATENT DOCUMENTS

| | | |
|---|---|---|
| 2004/0217694 A1* | 11/2004 | Cok et al. ............... 313/504 |
| 2005/0001542 A1* | 1/2005 | Kiguchi .................. 313/504 |
| 2005/0087740 A1* | 4/2005 | Matsumoto et al. ..... 257/72 |
| 2005/0127819 A1* | 6/2005 | Ohtani ................... 313/500 |
| 2005/0151462 A1* | 7/2005 | Miyagawa .............. 313/500 |
| 2007/0001584 A1* | 1/2007 | Lee et al. ............... 313/500 |
| 2007/0046185 A1* | 3/2007 | Kim ...................... 313/504 |
| 2008/0111459 A1* | 5/2008 | Helber et al. ........... 313/112 |
| 2008/0158107 A1* | 7/2008 | Miller et al. ............ 345/76 |
| 2008/0224968 A1* | 9/2008 | Kashiwabara ........... 345/83 |
| 2008/0231554 A1* | 9/2008 | Lee ........................ 345/63 |

\* cited by examiner

ORGANIC LIGHT EMITTING DIODE DISPLAY AND METHOD FOR MANUFACTURING THE SAME

CROSS-REFERENCE TO RELATED APPLICATION

This application claims priority to and the benefit of Korean Patent Application No. 10-2007-0115384, filed on Nov. 13, 2007, and Korean Patent Application No. 10-2008-0035774, filed on Apr. 17, 2008, both of which are hereby incorporated by reference for all purposes as if fully set forth herein.

BACKGROUND OF THE INVENTION

1. Field of the Invention

The present invention relates to an organic light emitting device and a method for manufacturing the same.

2. Discussion of the Background

Recent trends toward lightweight and thin personal computers and television sets require lightweight and thin display devices. Thus, thin and light flat panel displays, such as a liquid crystal display (LCD), are being substituted for conventional cathode ray tubes (CRTs).

However, because the LCD is a passive display device, an additional back-light is added as a light source. Also, the LCD may have various problems such as a slow response time and a narrow viewing angle.

Among flat panel displays, an organic light emitting device (organic light emitting diode display, OLED display) has the most promise as a display device for solving these problems.

The organic light emitting device includes two electrodes and an organic light emitting layer interposed between the two electrodes. One of the electrodes injects holes into the light emitting layer and the other injects electrons. The injected electrons and holes combine to form excitons, which emit light as they discharge energy.

Emission layers for displaying red, green, and blue colors may be used to display full colors, and the same color emission layers may be arranged in rows of stripes.

Emission layers having the stripe structure may be formed using a shadow mask. Here, the shadow mask includes a plurality of openings having substantially the same size and shape as the emission layers, and an organic material is deposited through the openings such that the plurality of emission layers arranged in a row may be simultaneously formed.

However, because intervals between openings arranged in a row or column may be narrow, it may be difficult to minutely form the edge portions of the openings. Accordingly, when depositing organic material through the openings, a shadow effect, in which the organic material is not minutely deposited on the portions corresponding to the edges of the openings, may be generated. In this case, the area of the emission layers that are actually deposited is decreased such that the emitting area is decreased, thereby reducing the aperture ratio.

The above information disclosed in this Background section is only for enhancement of understanding of the background of the invention and therefore it may contain information that does not form the prior art that is already known in this country to a person of ordinary skill in the art.

SUMMARY OF THE INVENTION

This invention provides an organic light emitting display device that may have an increased aperture ratio.

Additional features of the invention will be set forth in the description which follows, and in part will be apparent from the description, or may be learned by practice of the invention.

The present invention discloses an organic light emitting device including a plurality of first pixels including a first pixel electrode and an emission layer disposed on the first pixel electrode to display a first color; a plurality of second pixels including a second pixel electrode and an emission layer disposed on the second pixel electrode to display a second color; and a plurality of third pixels including a third pixel electrode and an emission layer disposed on the third pixel electrode to display a third color. The first and second pixels are arranged in a first column, the third pixels are arranged in a second column, and the emission layer of the third pixels overlaps at least two third pixel electrodes.

The present invention also discloses an organic light emitting device including a plurality of first pixels including an emission layer to display a first color; a plurality of second pixels including an emission layer to display a second color; and a plurality of third pixels including an emission layer to display a third color. The first and second pixels are arranged in a first column, the third pixels are arranged in a second column, and the emission layers of at least two third pixels are connected to each other.

The present invention also discloses an organic light emitting device including a plurality of red pixel groups arranged in a 2×2 matrix of four red pixels sharing one red emission layer; a plurality of green pixel groups arranged in a 2×2 matrix of four green pixels sharing one green emission layer; and a plurality of blue pixel groups arranged in a 2×2 matrix of four blue pixels sharing one blue emission layer. The red pixel groups and the green pixel groups are alternately arranged in a first column, the blue pixel groups are continuously arranged in a second column, and the first column and the second column are alternately arranged.

The present invention also discloses an organic light emitting device including a plurality of first, second, and third pixels to display different colors. The first and second pixels are arranged in a first column, the third pixels are arranged in a second column, and an interval between neighboring third pixels is larger than an interval between neighboring first and second pixels.

The present invention also discloses a method for manufacturing an organic light emitting device that includes forming a plurality of pixel electrodes on a substrate; forming a plurality of first, second, and third emission layers for respectively emitting light of first, second, and third colors on the pixel electrodes; and forming a common electrode on the first, second, and third emission layers. Forming the first, second, and third emission layers includes forming the first emission layers by using a first mask including a plurality of first openings, forming the second emission layers on positions neighboring the first emission layers by using the first mask, and forming the third emission layers on positions neighboring the first and second emission layers by using a second mask including a plurality of second openings having a different size from the first openings.

The present invention also discloses a method for manufacturing an organic light emitting device that includes forming a plurality of pixel electrodes on a substrate; forming a plurality of emission layers on the pixel electrodes; and forming a common electrode on the emission layers. Forming the emission layers includes sequentially forming a plurality of first, second, and third emission layers that display different colors, and at least one of the first, the second, and the third emission layers overlaps at least two neighboring pixel electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
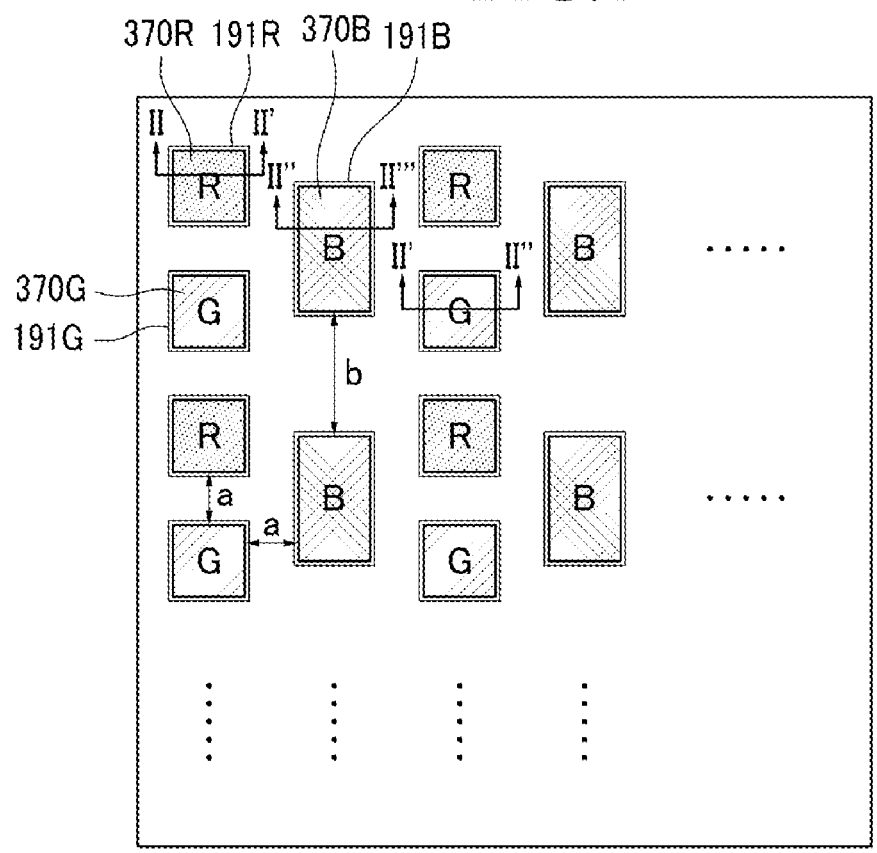
FIG. 1 is a top plan view schematically showing the arrangement of a plurality of pixels in an organic light emitting device according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

[First Embodiment]

An organic light emitting device according to an exemplary embodiment of the present invention will be described in detail with reference to FIG. 1 and FIG. 2.

Figure 2:
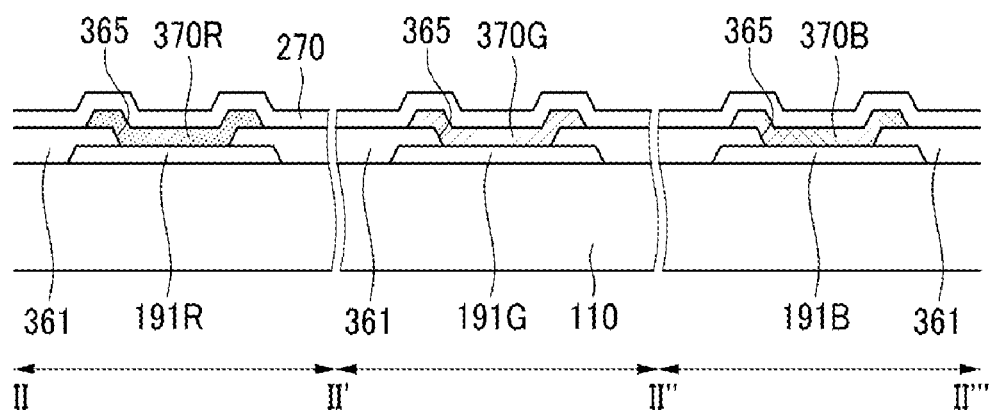
FIG. 2 is a cross-sectional view schematically showing a red pixel R, a green pixel G, and a blue pixel B taken along lines II-II', II'-II", and II"-II'" shown in FIG. 1.

FIG. 1 is a top plan view schematically showing the arrangement of a plurality of pixels in an organic light emitting device according to an exemplary embodiment of the present invention, and FIG. 2 is a cross-sectional view taken along lines II-II', II'-II", and II"-II'" of FIG. 1.

Referring to FIG. 1, an organic light emitting device according to an exemplary embodiment of the present invention includes red pixels R to display a red color, green pixels G to display a green color, and blue pixels B to display a blue color. The red pixels R, the green pixels G, and the blue pixels B form the basic pixel, which is used to display full colors, and three pixels forming one group are repeated according to a row and column.

In detail, the plurality of red pixels R and the plurality of green pixels G are alternately arranged in a first column, and the plurality of blue pixels B are continuously arranged in a second column.

Also, the red pixels R and the blue pixels B are alternately arranged in a row, and the green pixels G and the blue pixels B are also alternately arranged in a row.

According to this arrangement, neither the red pixels R, the green pixels G, nor the blue pixels B are continuously arranged in a line in the column or row directions.

Here, intervals b between neighboring blue pixels B are larger than intervals a between neighboring red pixels R and green pixels G. Also, the intervals a between the red pixels R and the green pixels G are substantially the same as the intervals a between the red pixels R and the blue pixels B and the green pixels G and the blue pixels B.

The red pixels R and the green pixels G have substantially the same area, and the blue pixels B may have a larger area than the areas of the red pixels R and the green pixels G. When bisecting one group including one red pixel R, one green pixel G, and one blue pixel B, the red pixel R and the green pixel G are disposed at the left side and the blue pixel B is disposed at the right side such that the area ratio may be controlled. Moreover, the arrangement of the pixels may vary.

The blue pixels B are larger than the red pixels R and the green pixels G to compensate for the blue emission layer, which has lower emitting efficiency and a shorter lifetime than the red and green emission layers. Thus, the luminance of the red, green, and blue pixels R, G, and B may be more uniform.

Referring to FIG. 2, the organic light emitting device according to an exemplary embodiment of the present invention includes a plurality of pixel electrodes 191R, 191G, and 191B, a plurality of organic emission layers 370R, 370G, and 370B, and a common electrode 270, which are formed on a substrate 110. The pixel electrodes 191R, 191G, and 191B, the organic emission layers 370R, 370G, and 370B, and the common electrode 270 form organic light emitting diodes (OLED). An insulating layer 361, for insulation between the pixel electrodes 191R, 191G, and 191B and the common electrode 270, may be included, and while not shown in the drawing, a plurality of signal lines including a plurality of gate lines, a plurality of data lines, and a plurality of driving voltage lines, a plurality of switching transistors connected to the gate lines and the data lines, and a plurality of driving transistors connected to the driving voltage lines, the switching transistors, and the pixel electrodes 191R, 191G, and 191B, may be further included.

A method for manufacturing the organic light emitting device shown in FIG. 1 and FIG. 2 will be described in detail below with reference to FIG. 3A, FIG. 3B, FIG. 4A, FIG. 4B, FIG. 4C, and FIG. 5, as well as FIG. 1 and FIG. 2.

Figure 3A:
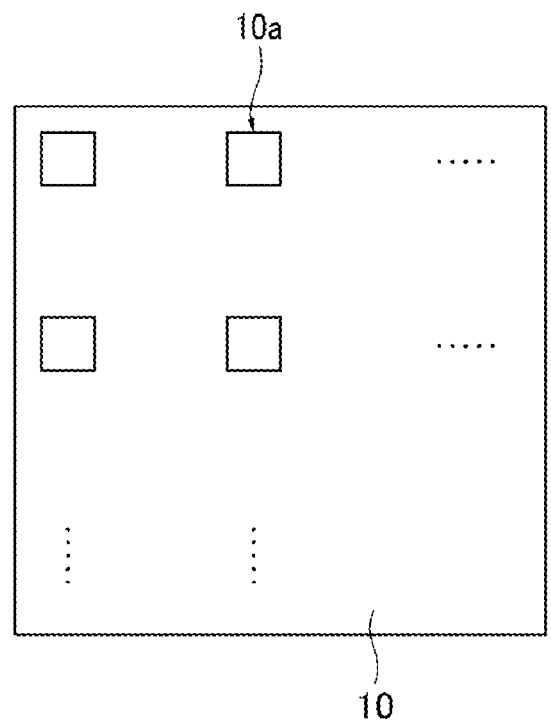
FIG. 3A and FIG. 3B are schematic diagrams showing a mask for forming an organic emission layer in a manufacturing method of an organic light emitting device according to an exemplary embodiment of the present invention.
Figure 3B:
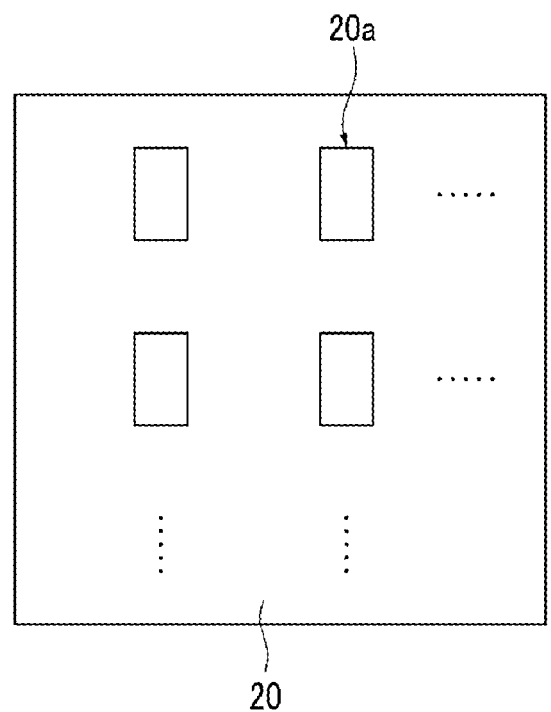
Figure 4A:
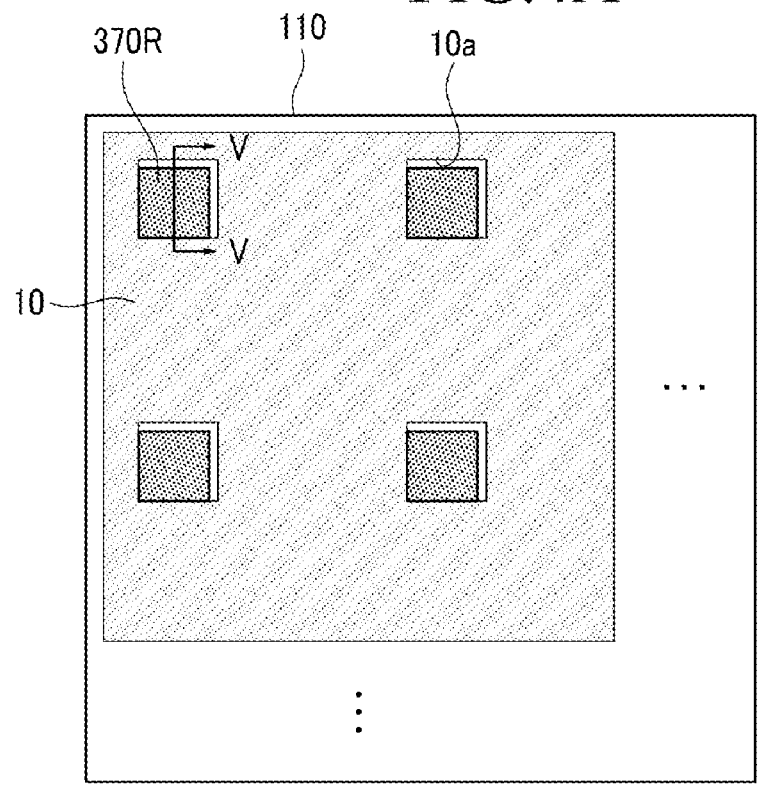
FIG. 4A, FIG. 4B, and FIG. 4C are schematic diagrams sequentially showing methods for forming the organic emission layer in the manufacturing method of the organic light emitting device shown in FIG. 1 and FIG. 2 according to an exemplary embodiment of the present invention.
Figure 4B:
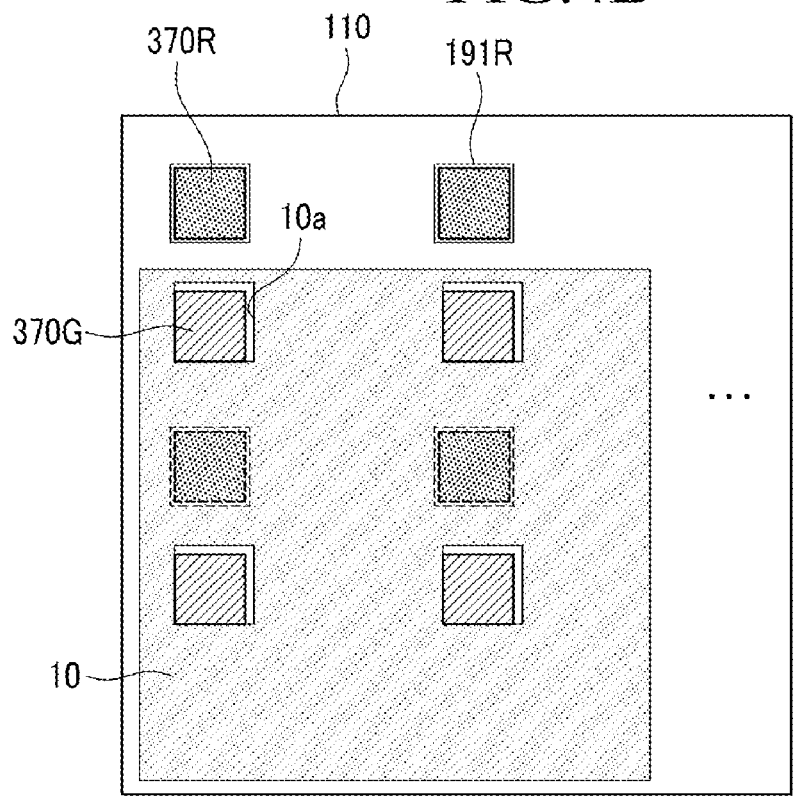
Figure 4C:
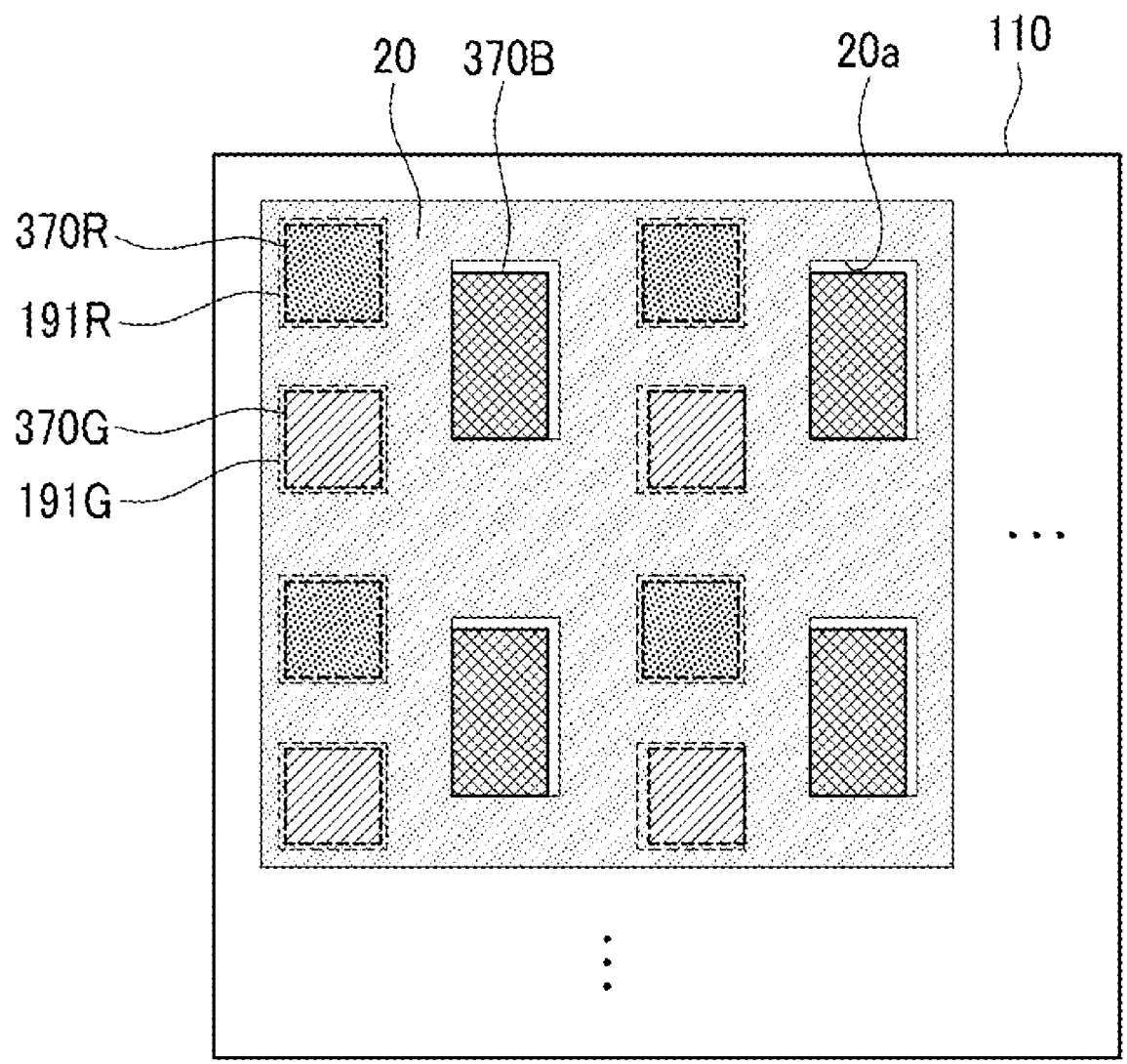
Figure 5:
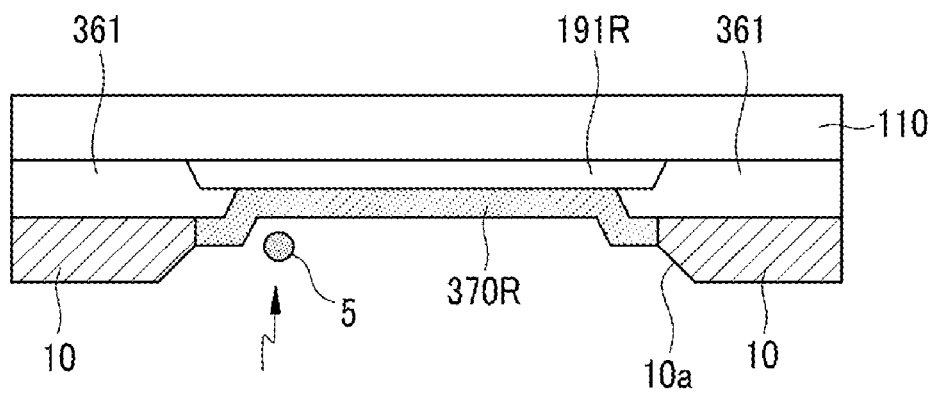
FIG. 5 is a cross-sectional view taken along line V-V shown in FIG. 4A.

FIG. 3A and FIG. 3B are schematic diagrams showing masks for forming an organic emission layer in a manufacturing method of an organic light emitting device according to an exemplary embodiment of the present invention, FIG. 4A, FIG. 4B, and FIG. 4C are schematic diagrams sequentially showing methods for forming the organic emission layer in the manufacturing method of the organic light emitting device shown in FIG. 1 and FIG. 2 according to an exemplary embodiment of the present invention, and FIG. 5 is a cross-sectional view taken along line V-V shown in FIG. 4A.

First, referring to FIG. 2, a plurality of pixel electrodes 191R, 191G, and 191B are formed on the insulation substrate 110, and the insulating layer 361 is deposited thereon. Here, the insulating layer 361 has a plurality of openings 365 exposing the pixel electrodes 191R, 191G, and 191B.

Next, emission layers 370R, 370G, and 370B are formed in respective openings 365.

The emission layers 370R, 370G, and 370B may be formed through a deposition method using a shadow mask.

Referring to FIG. 3A and FIG. 3B, in an exemplary embodiment of the present invention, two masks 10 and 20 are used to deposit the organic emission layers 370R, 370G, and 370B. As shown in FIG. 3A, the first mask 10 includes a plurality of openings 10a having an approximately square shape, and as shown in FIG. 3B, the second mask 20 includes a plurality of openings 20a having an approximately rectangular shape. The openings 20a have a larger area than the openings 10a.

Referring to FIG. 4A and FIG. 5, the first mask 10 is disposed on the substrate 110 including the pixel electrodes 191R, 191G, and 191B and the insulating layer 361. Next, a red emission material is deposited through the openings 10a of the first mask 10 to form a plurality of red emission layers 370R on the pixel electrodes 191R.

Referring to FIG. 4B, the first mask 10 is then moved a predetermined distance, and a green emission material is deposited through the openings 10a of the first mask 10 to form a plurality of green emission layers 370G on the pixel electrodes 191G.

Then, referring to FIG. 4C, the second mask 20 is disposed on the substrate 110, and a blue emission material is deposited through the openings 20a of the second mask 20 to form a plurality of blue emission layer 370B on the pixel electrodes 191B.

In this exemplary embodiment of the present invention, the red emission layers 370R and the green emission layers 370G are formed using the first mask 10, and the blue emission layers 370B are formed using the second mask 20.

Here, the red emission layers 370R and the green emission layers 370G are alternately arranged in a first column, and the blue emission layers 370B are continuously arranged in a second column that is adjacent to the first column. Also, the interval b between neighboring blue emission layers 370B is larger than the interval a between the red emission layers 370R and the green emission layers 370G.

In this exemplary embodiment of the present invention, the organic emission layers are formed using masks including sufficient intervals between openings to form the above-described pixel arrangement. When using masks including sufficient intervals between openings, spaces between the openings may be manufactured such that the organic material may be precisely deposited on the portions where the edges of the openings meet each other when depositing the organic material through the openings. In this case, because the organic emission layer may be formed to have the same size as the openings of the mask, the emission area and the aperture ratio may be improved.

These effects according to an exemplary embodiment of the present invention may be explained by comparing an organic light emitting device having a conventional stripe structure.

The organic light emitting device including the stripe structure and a method for manufacturing the same will be described in detail below with reference to FIG. 6, FIG. 7, FIG. 8A, FIG. 8B, FIG. 8C, and FIG. 9.

Figure 6:
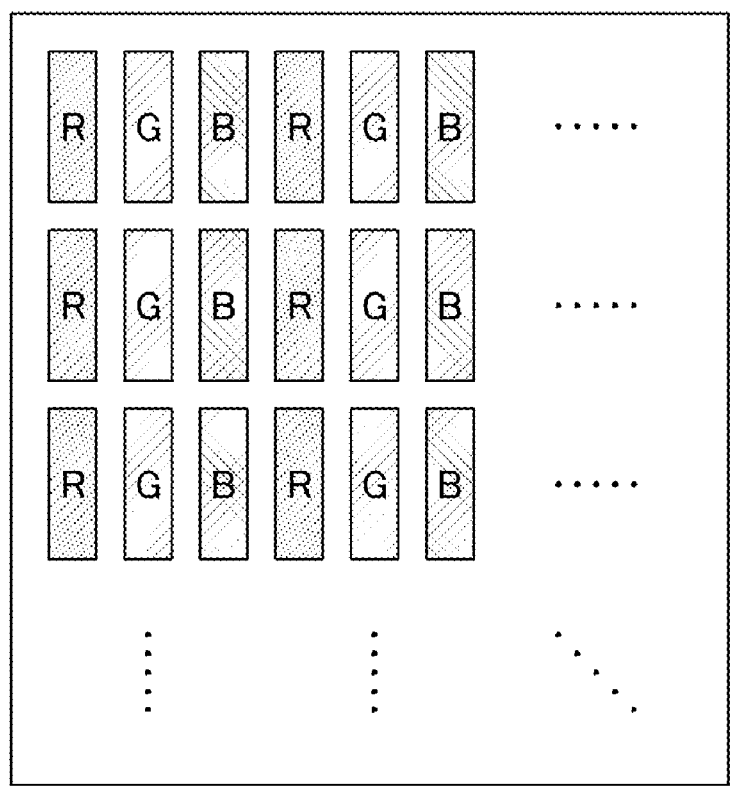
FIG. 6 is a top plan view schematically showing the arrangement of a plurality of pixels in an organic light emitting device of a stripe structure.
Figure 7:
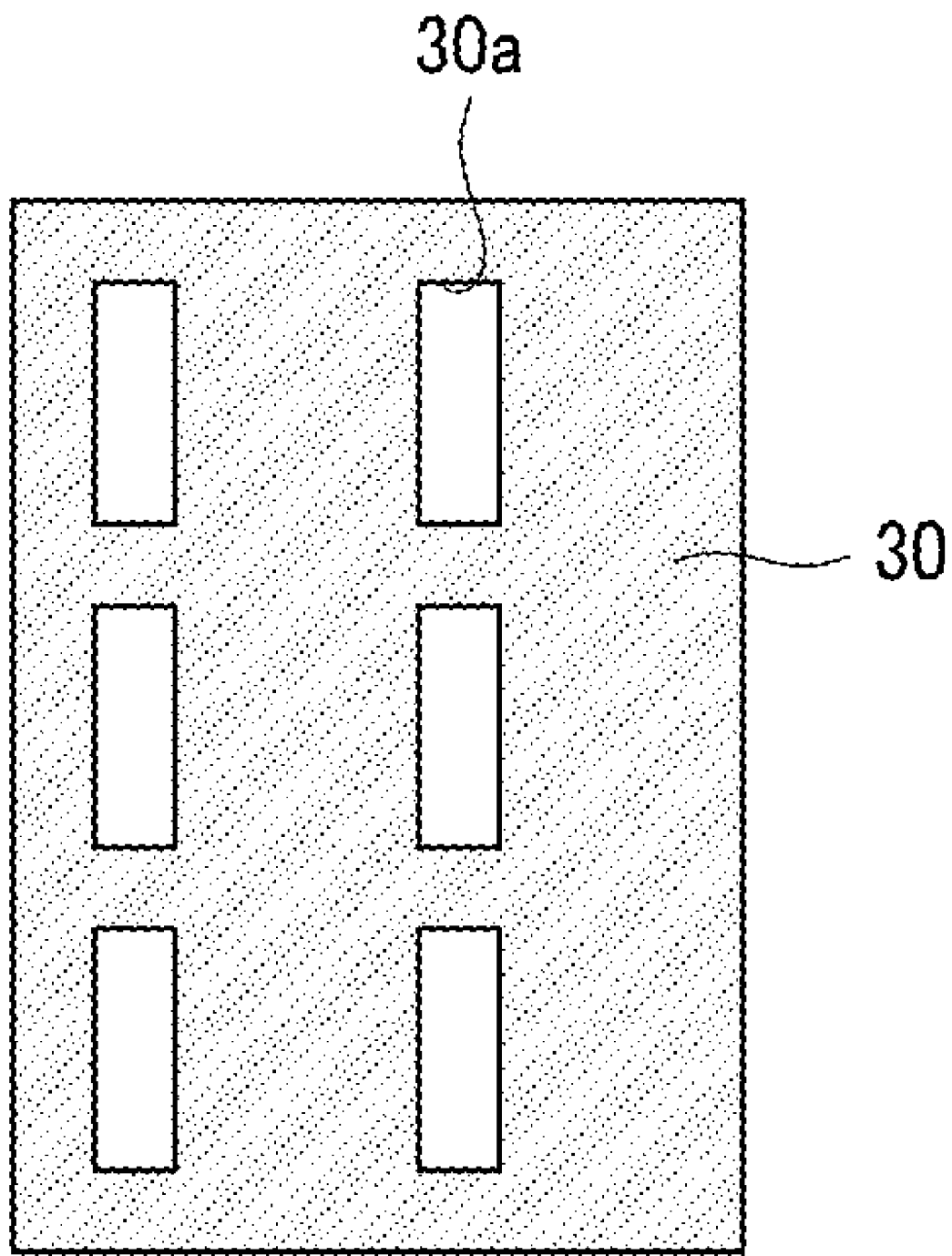
FIG. 7 is a schematic diagram showing a mask for forming an organic emission layer in an organic light emitting device of a stripe structure.
Figure 8A:
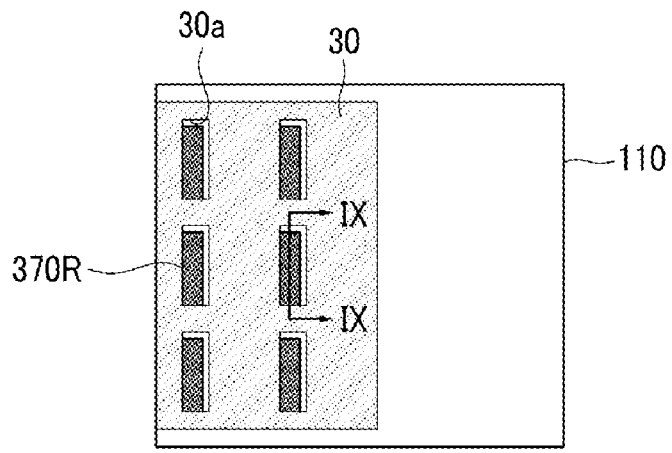
FIG. 8A, FIG. 8B, and FIG. 8C are schematic diagrams sequentially showing methods for forming the organic emission layer of a stripe structure in a manufacturing method of an organic light emitting device.
Figure 8B:
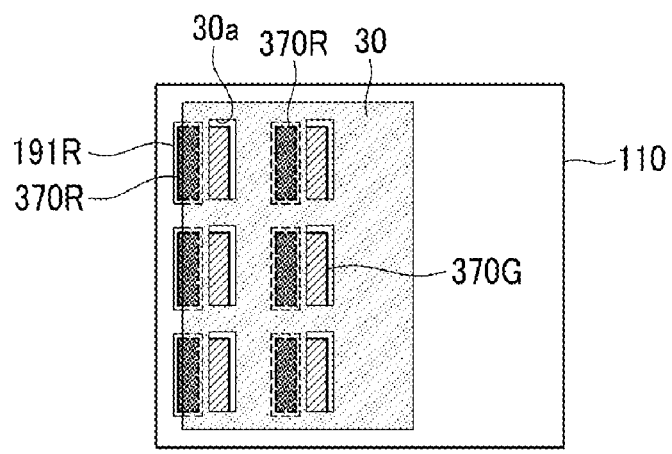
Figure 8C:
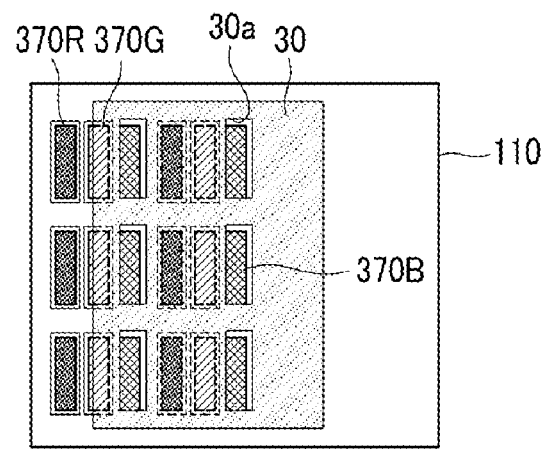
Figure 9:
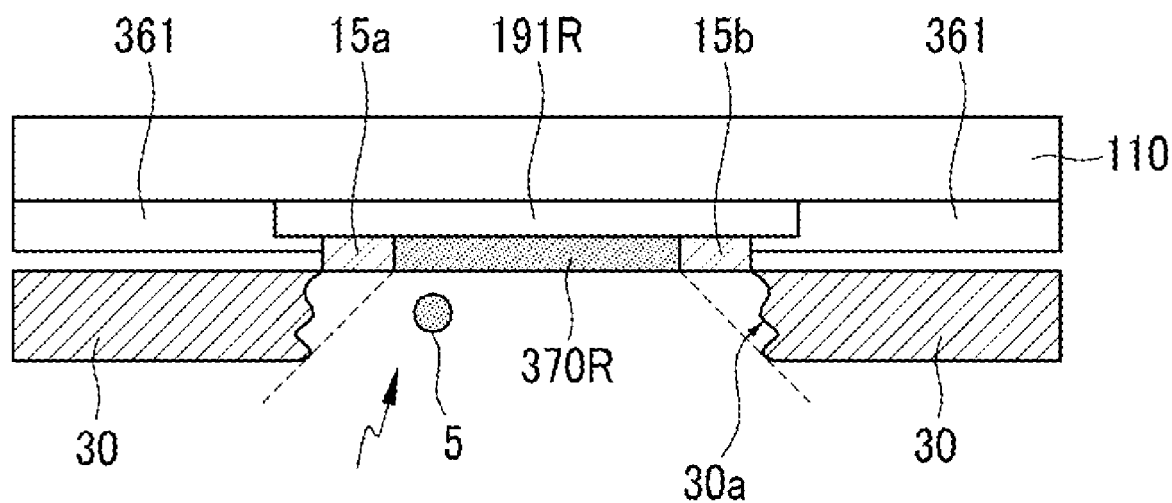
FIG. 9 is a cross-sectional view taken along line IX-IX shown in FIG. 8A.

FIG. 6 is a top plan view schematically showing the arrangement of a plurality of pixels in an organic light emitting device of a stripe structure, FIG. 7 is a schematic diagram showing a mask for forming an organic emission layer in an organic light emitting device of a stripe structure, FIG. 8A, FIG. 8B, and FIG. 8C are schematic diagrams sequentially showing methods for forming of the organic emission layer in the manufacturing method of the organic light emitting device of a stripe structure, and FIG. 9 is a cross-sectional view taken along line IX-IX shown in FIG. 8A.

Referring to FIG. 6, an organic light emitting device of the stripe structure includes a plurality of red pixels R arranged in a first column, a plurality of green pixels G arranged in a second column, and a plurality of blue pixels B arranged in a third column. A red pixel R, a green pixel G, and a blue pixel B arranged in the row direction form one group.

A manufacturing method of the organic light emitting device will be described with reference to FIG. 7, FIG. 8A, FIG. 8B, FIG. 8C, and FIG. 9.

Referring to FIG. 7, one mask 30 may be used to deposit the emission layers in the organic light emitting device of the stripe structure. That is, because the red, green, and blue emission layers 370R, 370G, and 370B have the same shape and size, they may be formed using the same mask 30. Here, the mask 30 includes a plurality of openings 30a having a substantially rectangular shape, and the openings 30a are arranged with narrower intervals than those of the openings 10a and 20a of the masks 10 and 20 according to an exemplary embodiment of the present invention.

Referring to FIG. 8A and FIG. 9, the third mask 30 is disposed on the substrate 110 including the pixel electrodes 191R and the insulating layer 361. Next, a red emission material is deposited through the openings 30a of the third mask 30 to form a red emission layer 370R on the pixel electrodes 191R.

Then, referring to FIG. 8B, the third mask 30 is moved a predetermined distance, and a green emission material is deposited through the openings 30a of the third mask 30 to form a green emission layer 370G on the pixel electrodes 191G.

Referring to FIG. 8c, the third mask 30 is then again moved a predetermined distance, and a blue emission material is deposited through the openings 30a of the third mask 30 to form a blue emission layer 370B on the pixel electrodes 191B.

Accordingly, in the manufacturing method of the organic light emitting device of the stripe structure, one mask 30 moves three times to form the red, green, and blue emission layers 370R, 370G, and 370B. Here, because the intervals between the openings 30a of the mask 30 are narrow, it may be difficult to minutely manufacture the edges of the openings when manufacturing the mask.

Referring to FIG. 9, when intervals between the openings 30a are narrow, because both side surfaces of the openings are etched when manufacturing the mask, the edge portions of the opening may not be minutely formed. Thus, the side surfaces of the opening may have an uneven shape. In this case, when depositing the organic material through the openings 30a, a shadow effect, in which the organic material is not deposited on portions 15a and 15b corresponding to the edges of the openings, may be generated such that the area where the organic material is deposited is reduced. Accordingly, the organic emission layer is actually formed with a smaller area than the size of the opening. Consequently, the emission area and the aperture ratio are reduced.

Comparing FIG. 5 with FIG. 9, because the deposition area of the organic emission layer formed according to an exemplary embodiment of the present invention is larger than the deposition area of the organic emission layer formed in the organic light emitting device of the stripe structure, the emission area and the aperture ratio may be increased.

[Second Embodiment]

An organic light emitting device according to another exemplary embodiment of the present invention will be described in detail below with reference to FIG. 10 and FIG. 11.

Figure 10:
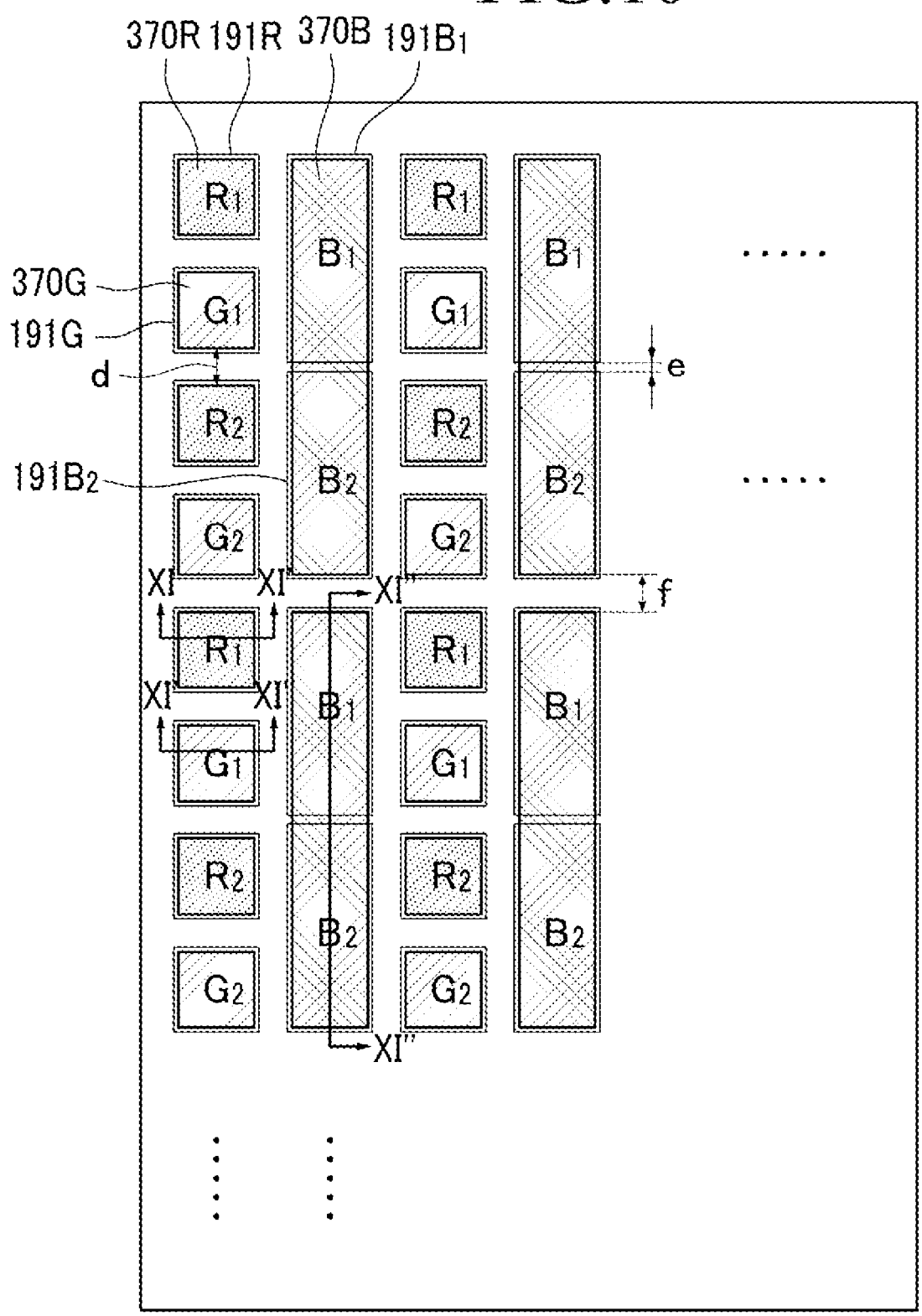
FIG. 10 is a top plan view schematically showing the arrangement of a plurality of pixels in an organic light emitting device according to another exemplary embodiment of the present invention.
Figure 11:
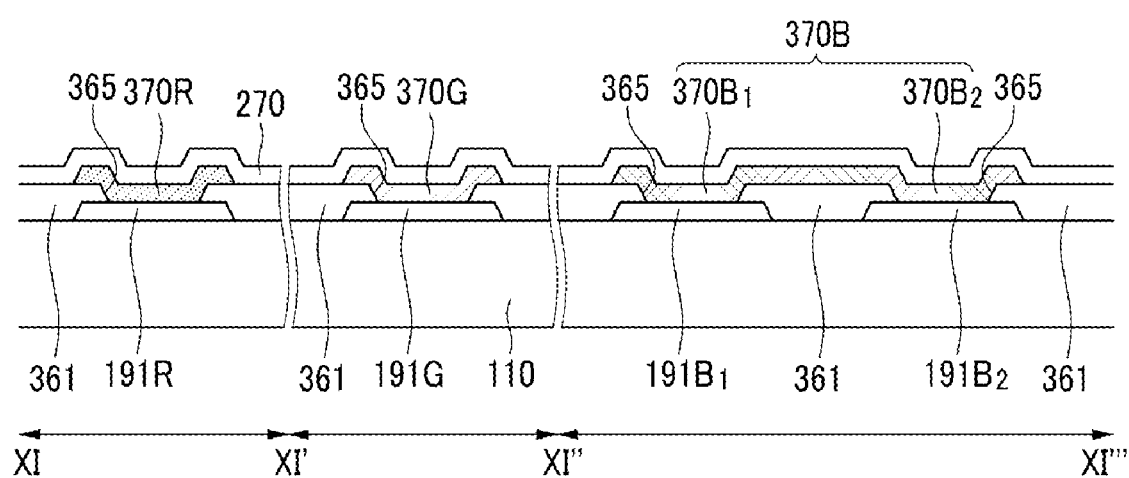
FIG. 11 is a cross-sectional view schematically showing a red pixel R, a green pixel G, and a blue pixel B taken along lines XI-XI', XI'-XI", and XI"-XI'" shown in FIG. 10.

FIG. 10 is a top plan view schematically showing the arrangement of a plurality of pixels in an organic light emitting device according to the present exemplary embodiment of the present invention, and FIG. 11 is a cross-sectional view schematically showing a red pixel R, a green pixel G, and a blue pixel B taken along lines XI-XI', XI'-XI'', and XI''-XI''' shown in FIG. 10.

Referring to FIG. 10, regarding the arrangement of the pixels in an organic light emitting device according to this exemplary embodiment, the plurality of red pixels R and the plurality of green pixels G are alternately arranged in a first column, and the plurality of blue pixels B are continuously arranged in a second column, like the above-described embodiment.

Also, the red pixels R and the blue pixels B are alternately arranged in a row, and the green pixels G and the blue pixels B are also alternately arranged in a row.

Here, the intervals d between the red pixels R and the green pixels G are the same as the interval between the red pixels R and the blue pixels B, and between the green pixels G and the blue pixels B. Also, two neighboring blue pixels B1 and B2 form one blue pixel group, and the interval f between two neighboring blue pixel groups is larger than the interval d between the red pixels R and the green pixels G.

Differently from the previous embodiment, the emission layers of two neighboring blue pixels B1 and B2 are formed of one pattern. That is, in this exemplary embodiment, the emission layers 370B of the blue pixels B overlap two neighboring pixel electrodes 191B1 and 191B2.

Referring to FIG. 10 and FIG. 11, the red emission layer 370R is formed on the pixel electrode 191R in the red pixel R, and the green emission layer 370G is formed on the pixel electrode 191G in the green pixel G. However, the emission layer 370B of the first and second blue pixels B1 and B2, which are neighboring blue pixels in the column of the blue pixels, is formed of one pattern. Here, one portion of the blue emission layer 370B is the emission layer 370B1 of the first blue pixel B1, and another portion of the blue emission layer 370B is the emission layer 370B2 of the second blue pixel B2. To form this blue emission layer 370B, a shadow mask having an opening with a size corresponding to the sum of the emission areas of the first and second blue pixels B1 and B2 may be used, and will be described below in detail.

Here, the emission layer 370B of two neighboring blue pixels B1 and B2 is formed of one pattern such that they are connected without an interval therebetween, and the interval between two neighboring first and second blue pixels B1 and B2 is substantially determined by the interval e between the pixel electrode 191B1 of the first blue pixel B1 and the pixel electrode 191B2 of the second blue pixel B2. The interval e between the pixel electrode 191B1 and the pixel electrode 191B2 is unrelated to the shadow mask, which is used to deposit the emission layer 370B, such that the shadow effect, in which the emission area is reduced by the limits of the shadow mask, may be prevented.

A method for manufacturing the organic light emitting device shown in FIG. 10 and FIG. 11 will be described in detail below with reference to FIG. 12A, FIG. 12B, FIG. 13A, FIG. 13B, and FIG. 13C, as well as FIG. 10 and FIG. 11.

Figure 12A:
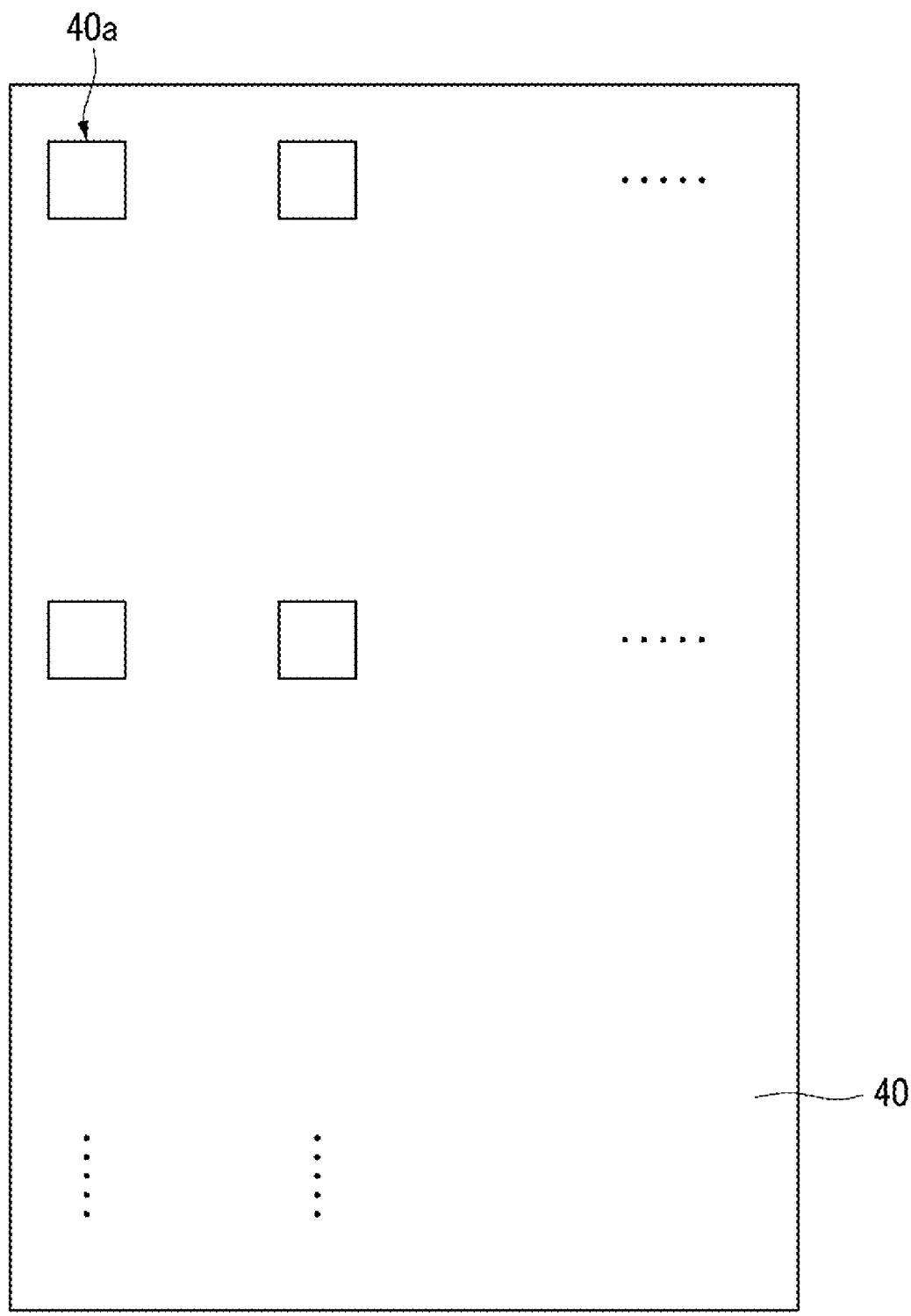
FIG. 12A and FIG. 12B are schematic diagrams showing a mask for forming an organic emission layer in a manufacturing method of an organic light emitting device according to another exemplary embodiment of the present invention.
Figure 12B:
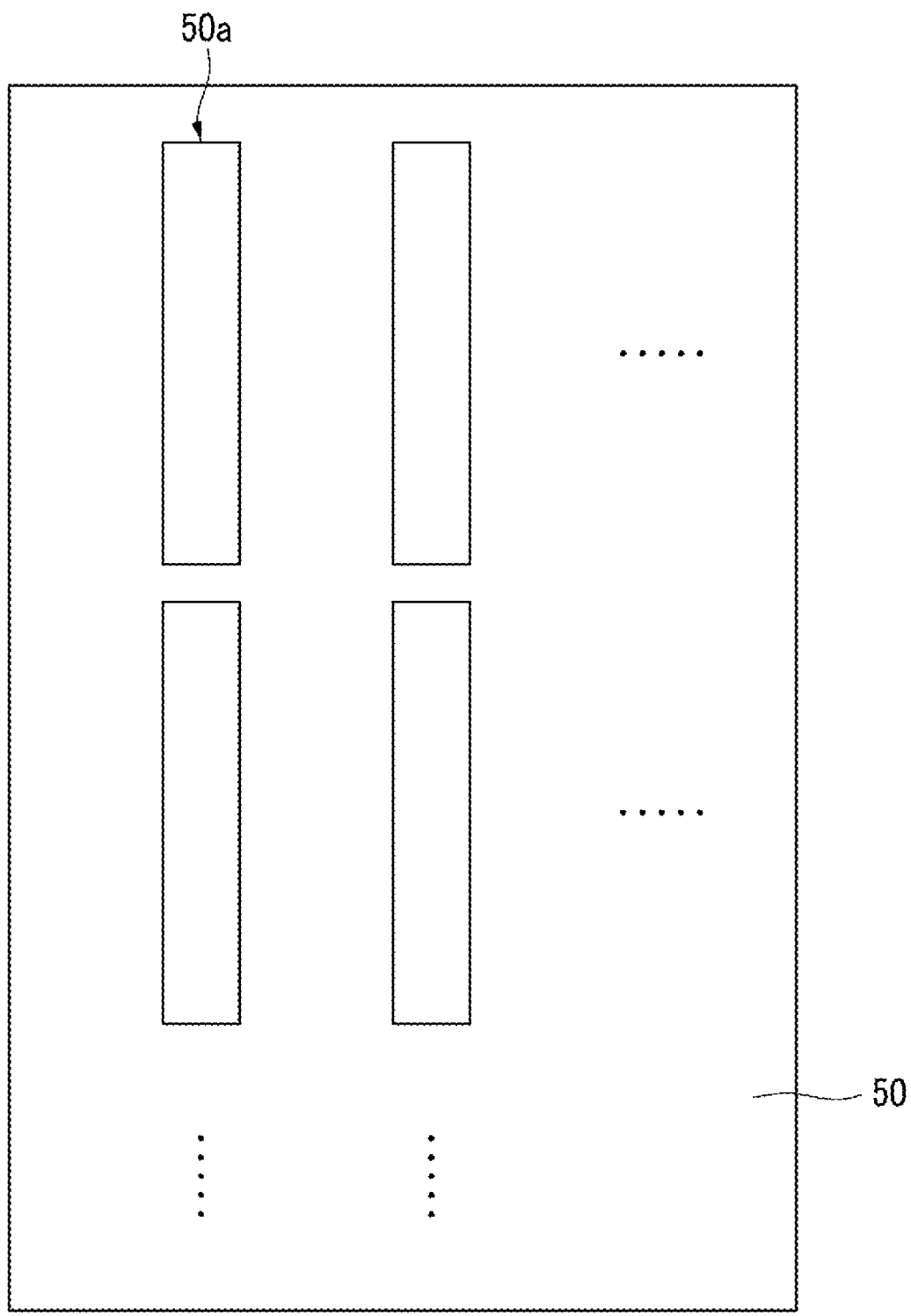
Figure 13A:
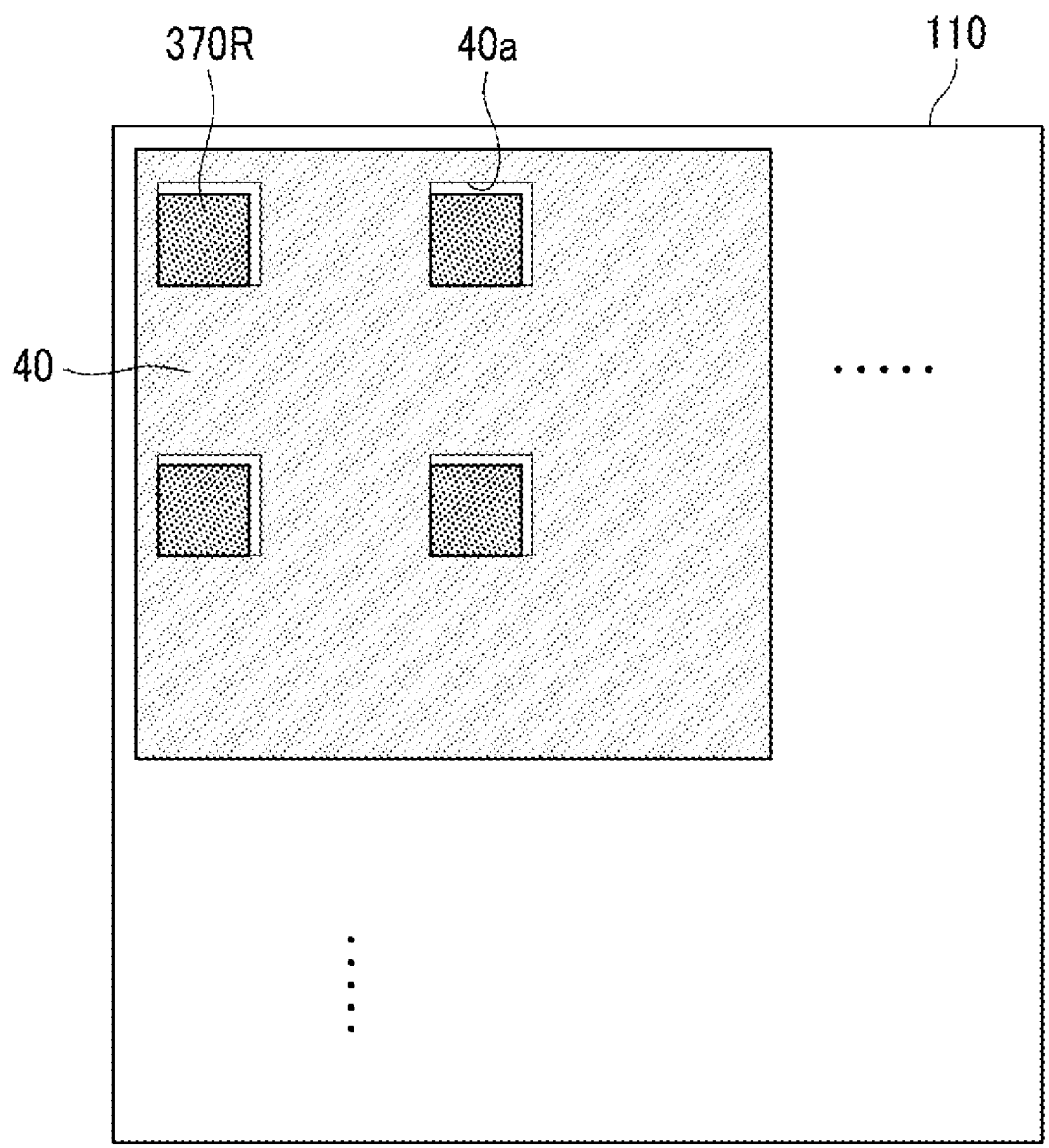
FIG. 13A, FIG. 13B, and FIG. 13C are schematic diagrams sequentially showing methods for forming the organic emission layer in the manufacturing method of the organic light emitting device shown in FIG. 10 and FIG. 11 according to another exemplary embodiment of the present invention.
Figure 13B:
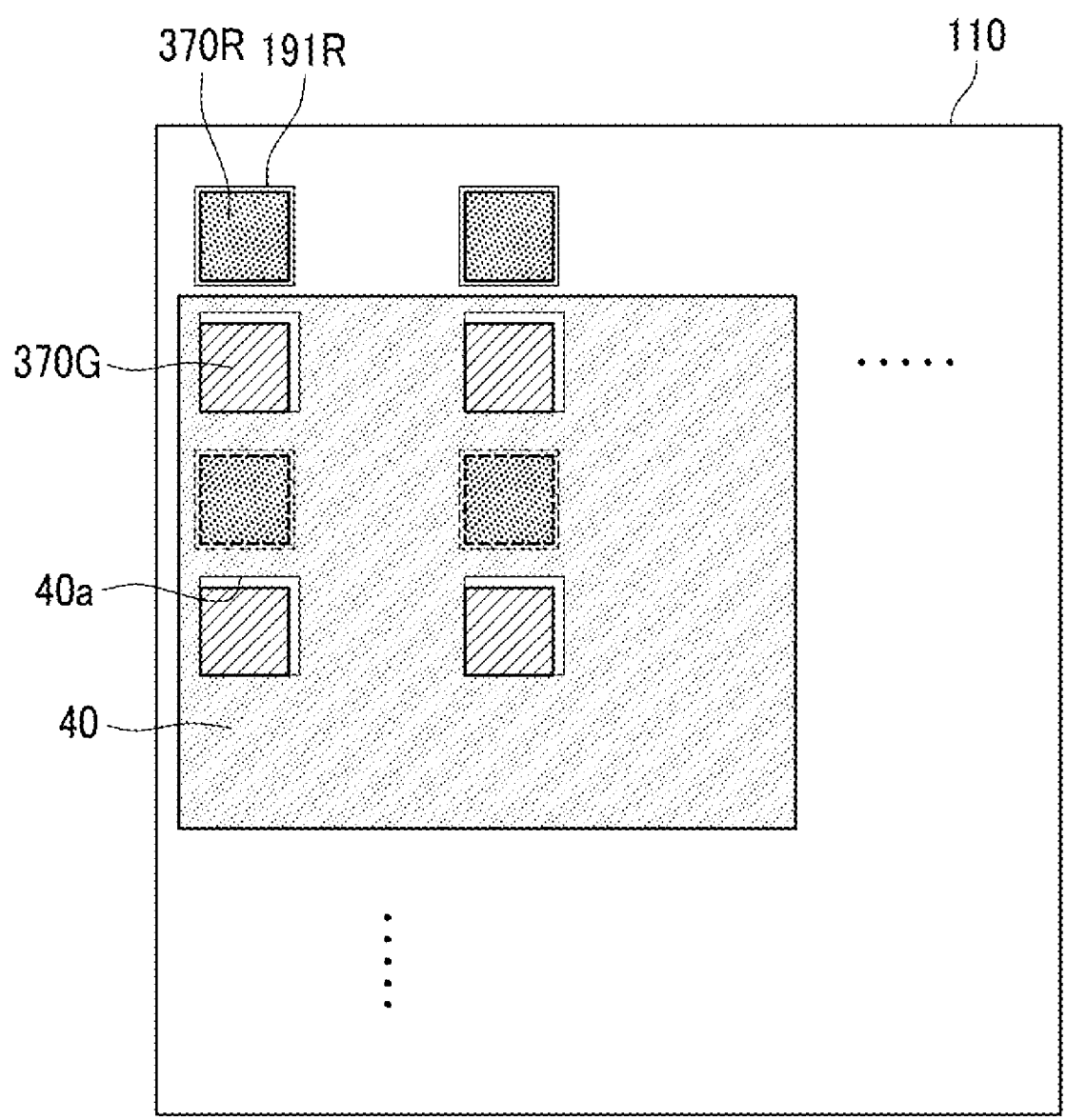
Figure 13C:
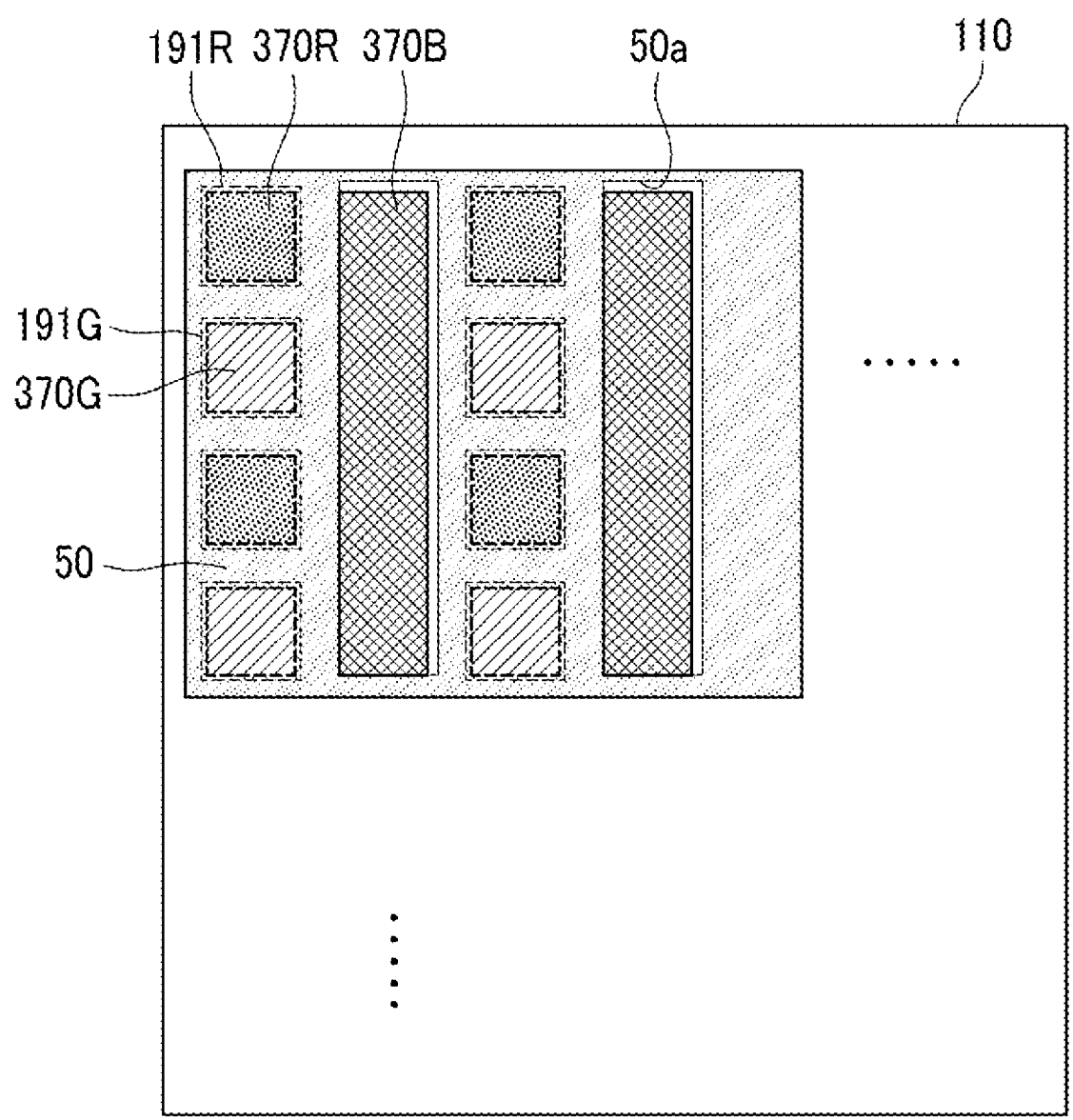

FIG. 12A and FIG. 12B are schematic diagrams showing masks for forming an organic emission layer in a manufacturing method of an organic light emitting device according to the current exemplary embodiment of the present invention, and FIG. 13A, FIG. 13B, and FIG. 13C are schematic diagrams sequentially showing methods for forming of the organic emission layer in the manufacturing method of the organic light emitting device shown in FIG. 10 and FIG. 11.

First, referring to FIG. 11, a plurality of pixel electrodes 191R, 191G, 191B1, and 191B2 are formed on an insulation substrate 110, and an insulating layer 361 is deposited thereon. Here, the insulating layer 361 has a plurality of openings 365 exposing the pixel electrodes 191R, 191G, 191B1, and 191B2.

Next, emission layers 370R, 370G, and 370B are formed in respective openings 365. The emission layers 370R, 370G, and 370B may be formed through a deposition method using a shadow mask.

Referring to FIG. 12A and FIG. 12B, in an exemplary embodiment of the present invention, two masks 40 and 50 are used to deposit the organic emission layers 370R, 370G, and 370B. As shown in FIG. 12A, the fourth mask 40 includes a plurality of openings 40a having an approximately square shape, and it may be the same as the first mask 10 used to form the red emission layers 370R and the green emission layers 370G in the previous exemplary embodiment. As shown in FIG. 12B, the fifth mask 50 includes a plurality of openings 50a having an approximately rectangular shape. The openings 50a have a larger area than the openings 40a.

Referring to FIG. 13A, the fourth mask 40 is disposed on the substrate 110 including the pixel electrodes 191R, 191G, 191B1, and 191B2, and the insulating layer 361. Next, a red emission material is deposited through the openings 40a of the fourth mask 40 to form a plurality of red emission layers 370R on the pixel electrodes 191R, like the above-described embodiment.

Next, referring to FIG. 13B, the fourth mask 40 is moved a predetermined distance, and a green emission material is deposited through the openings 40a of the first mask 40 to form a plurality of green emission layers 370G on the pixel electrodes 191G.

Referring to FIG. 13C, the fifth mask 50 is then disposed on the substrate 110, and a blue emission material is deposited through the openings 50a of the second mask 50 to form a plurality of blue emission layers 370B on the pixel electrodes 191B1 and 191B2. The blue emission layers 370B overlap the two pixel electrodes 191B1 and 191B2.

In this exemplary embodiment of the present invention, the red emission layers 370R and the green emission layers 370G are formed using the fourth mask 40, and two neighboring blue emission layers 370B1 and 370B2 are formed in one pattern using the fifth mask 50.

In this exemplary embodiment of the present invention, the organic emission layers are formed through the above-described method such that they may be formed using a mask including sufficient intervals between openings to form the above-described pixel arrangement. When using the mask including sufficient intervals between openings, the spaces between the openings may be minutely manufactured such that the organic material is precisely deposited to the portions where the edges of the openings meet each other when depositing the organic material through the openings.

Particularly, the organic emission layer of two neighboring blue pixels is formed in one pattern such that a shadow effect generated by limits of the shadow mask of the case in which the emission layers are separately formed may be prevented. Accordingly, reduction of the emission area and the aperture ratio by the interval between the emission layers may be prevented.

[Third Embodiment]

An organic light emitting device according to another exemplary embodiment of the present invention will be described in detail below with reference to FIG. 14 and FIG. 15.

Figure 14:
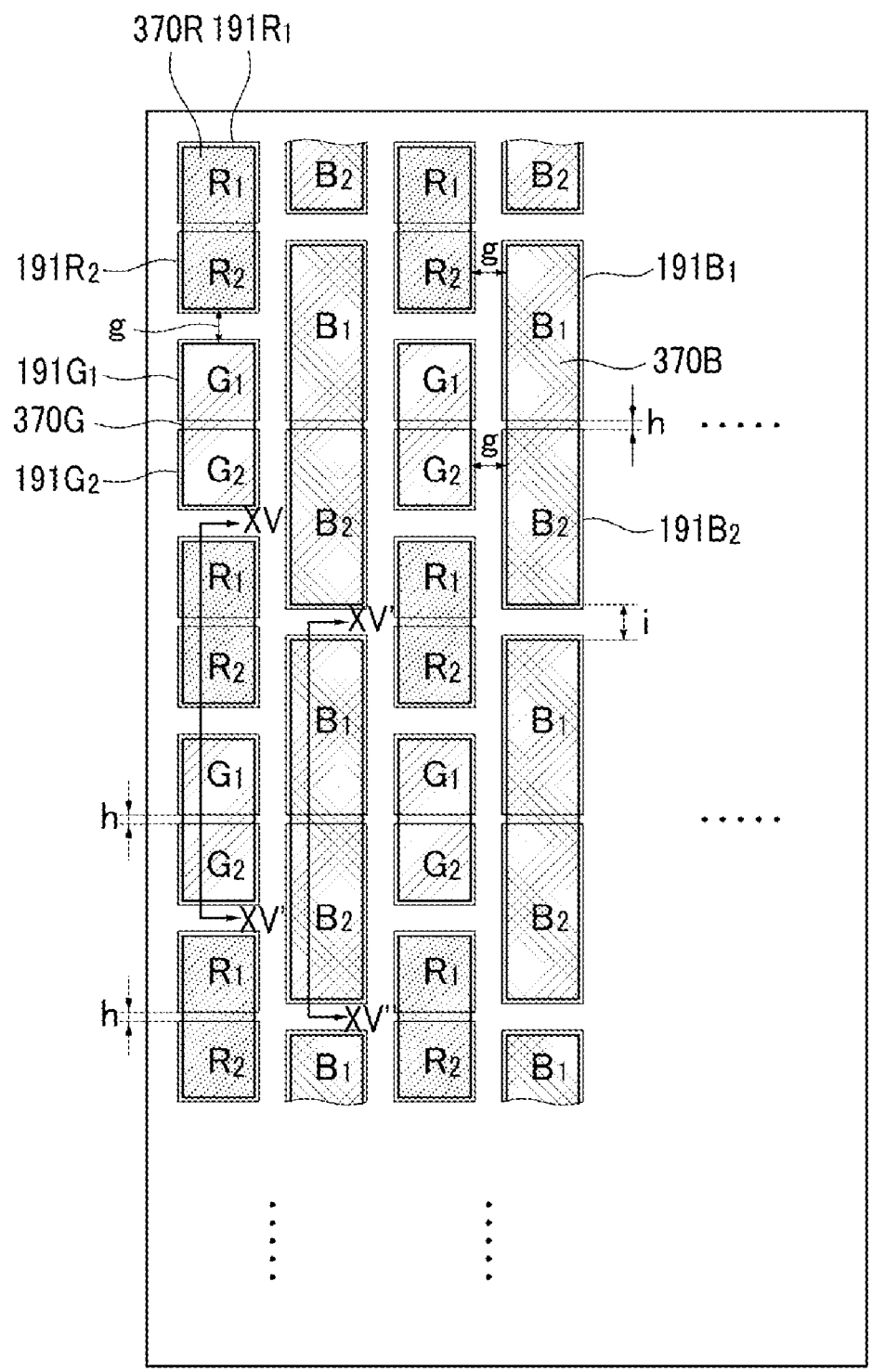
FIG. 14 is a top plan view schematically showing the arrangement of a plurality of pixels in an organic light emitting device according to another exemplary embodiment of the present invention.
Figure 15:
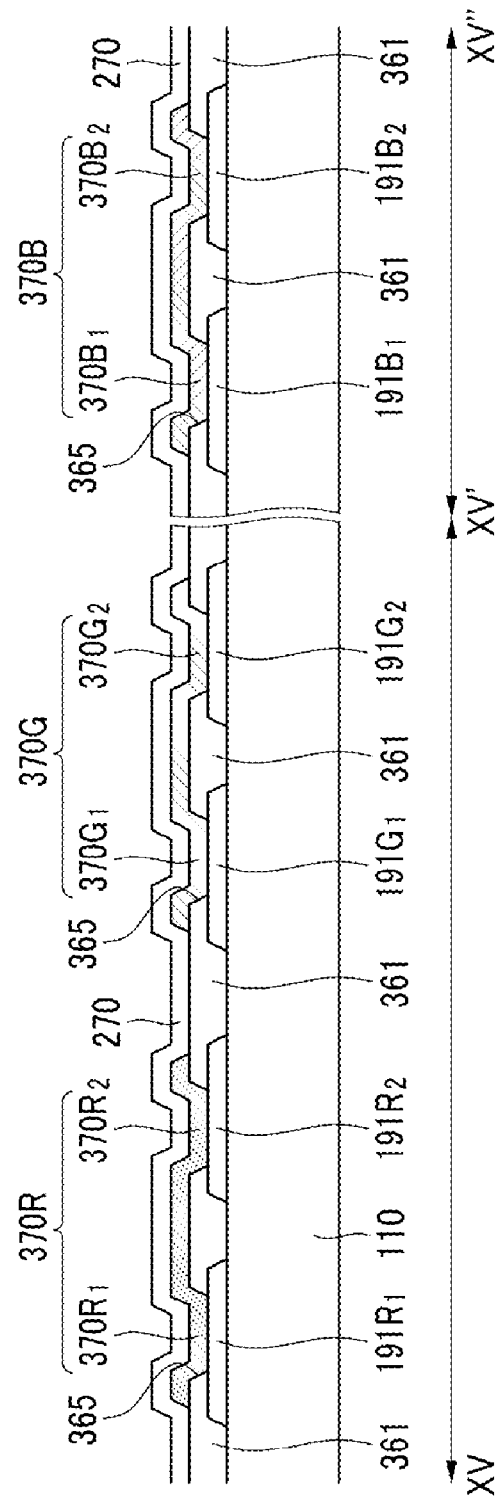
FIG. 15 is a cross-sectional view schematically showing a red pixel R, a green pixel G, and a blue pixel B taken along lines XV-XV' and XV'-XV" shown in FIG. 14

FIG. 14 is a top plan view schematically showing the arrangement of a plurality of pixels in an organic light emitting device according to another exemplary embodiment of the present invention, and FIG. 15 is a cross-sectional view schematically showing a red pixel R, a green pixel G, and a blue pixel B taken along lines XV-XV' and XV'-XV" shown in FIG. 14.

Referring to FIG. 14, the plurality of red pixels R and the plurality of blue pixels B are alternately arranged in a row, and the plurality of green pixels G and the plurality of blue pixels B are also alternately arranged in a row, like the above-described embodiment.

Here, the intervals g between the red pixels R and the green pixels G, between the red pixels R and the blue pixels B, and between the green pixels G and the blue pixels B are substantially the same. When two neighboring blue pixels B1 and B2 form one blue pixel group, the interval i between two neighboring blue pixel groups is larger than the interval g.

Differently from the previous embodiment, the red pixels R and the green pixels G are repeatedly disposed by twos in the column direction. Like the previous embodiment in which the emission layers 370B of two neighboring blue pixels B1 and B2 are formed of one pattern in the column direction, the emission layers 370R of two neighboring red pixels R1 and R2 and/or the emission layers 370G of two neighboring green pixels G1 and G2 are each formed of one pattern.

In this way, a portion of the blue emission layer 370B is the emission layer 370B1 of the first blue pixel B1 and another portion of the blue emission layer 370B is the emission layer 370B2 of the second blue pixel B2, a portion of the red emission layer 370R is the emission layer 370R1 of the first red pixel R1 and another portion of the red emission layer 370R is the emission layer 370R2 of the second red pixel R2, and a portion of the green emission layer 370G is the emission layer 370G1 of the first green pixel G1 and another portion of the green emission layer 370G is the emission layer 370G2 of the second green pixel G2.

To form the red emission layer 370R or the green emission layer 370G, a shadow mask having openings with a size corresponding to the sum of the emission areas of neighboring first and second red pixels R1 and R2, or neighboring first and second green pixels G1 and G2, may be used.

Here, the emission layer 370R of two neighboring red pixels R1 and R2 is formed of one pattern such that they are connected without an interval therebetween, and the interval between neighboring first and second red pixels R1 and R2 is substantially determined by the interval h between the pixel electrodes 191R1 of the first red pixel R1 and the pixel electrode 191R2 of the second red pixel R2. In the same way, the emission layer 370G of two neighboring green pixels G1 and G2 is formed of one pattern such that they are connected without an interval therebetween, and the interval between two neighboring first and second green pixels G1 and G2 is substantially determined by the interval h between the pixel electrodes 191G1 of the first green pixel G1 and the pixel electrode 191G2 of the second green pixel G2.

The interval h between the pixel electrode 191R1 and the pixel electrode 191R2 or the pixel electrode 191G1 and the pixel electrode 191G2 is unrelated to the shadow mask used to deposit the emission layer 370R and 370G such that the shadow effect, in which the emission area is reduced by the limits of the shadow mask, may be prevented.

A method for manufacturing the organic light emitting device shown in FIG. 14 and FIG. 15 will be described in detail below with reference to FIG. 16A, FIG. 16B, FIG. 17A, FIG. 17B, and FIG. 17C, as well as FIG. 14 and FIG. 15.

Figure 16A:
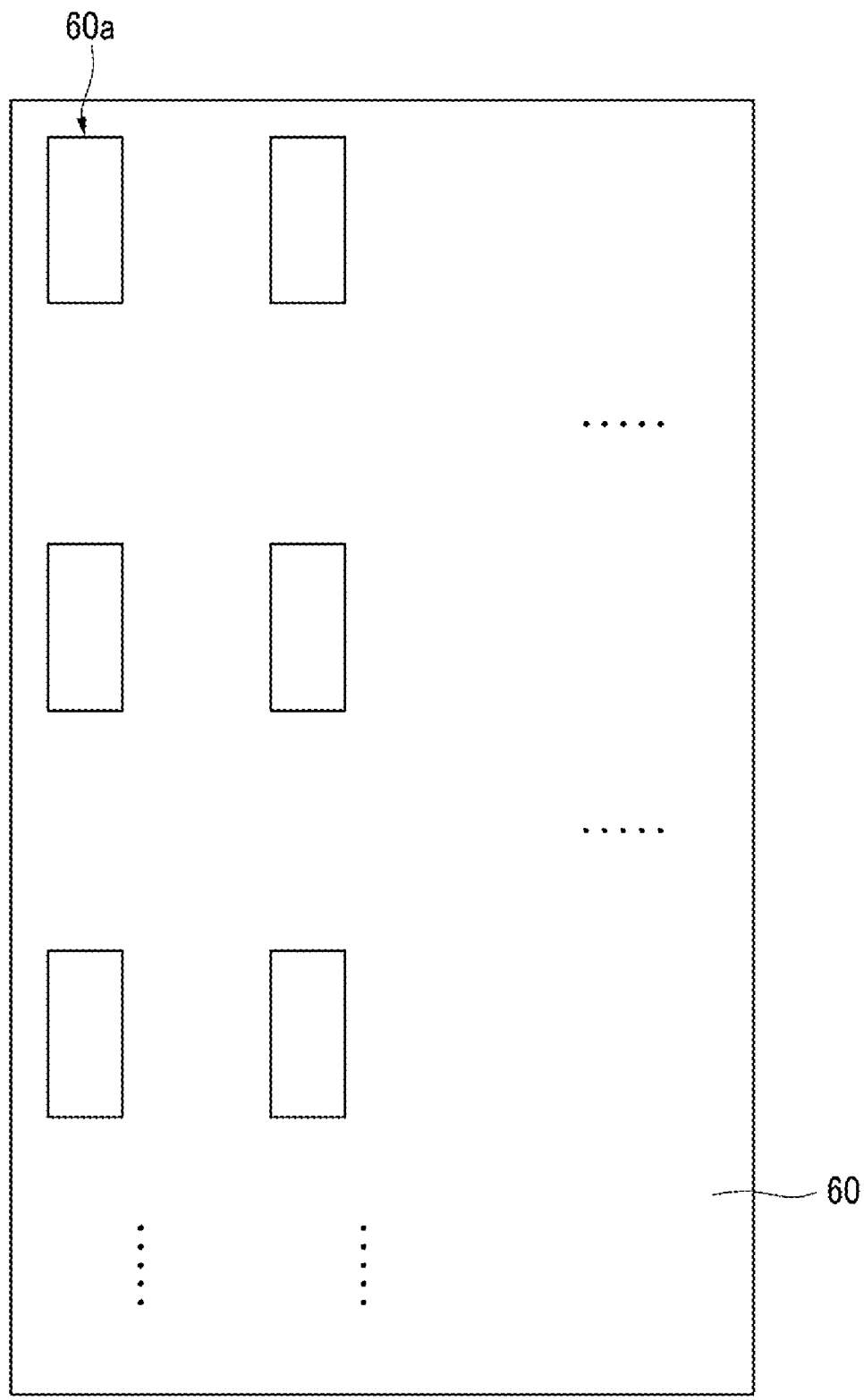
FIG. 16A and FIG. 16B are schematic diagrams showing a mask for forming an organic emission layer in a manufacturing method of an organic light emitting device according to another exemplary embodiment of the present invention.
Figure 16B:
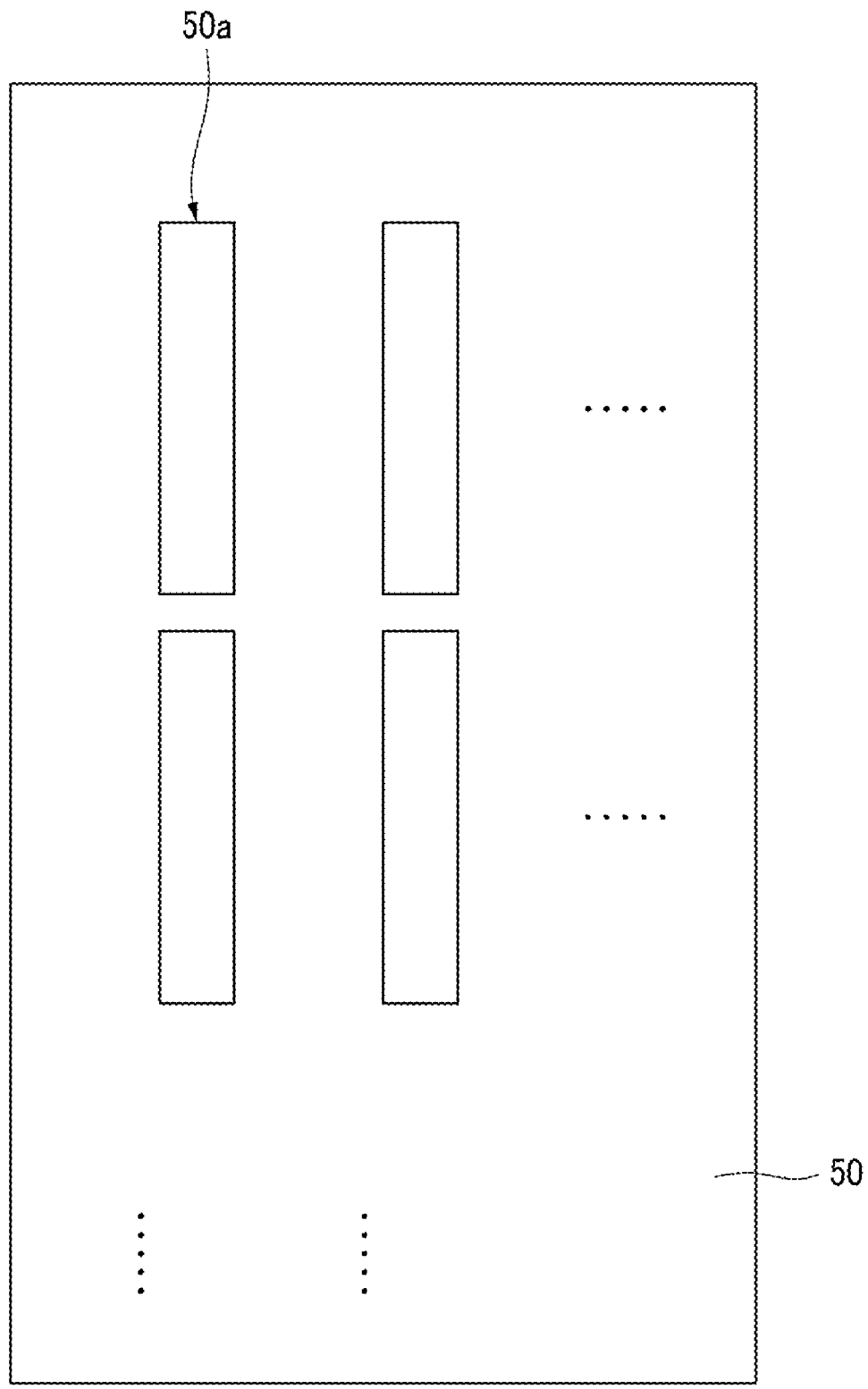
Figure 17A:
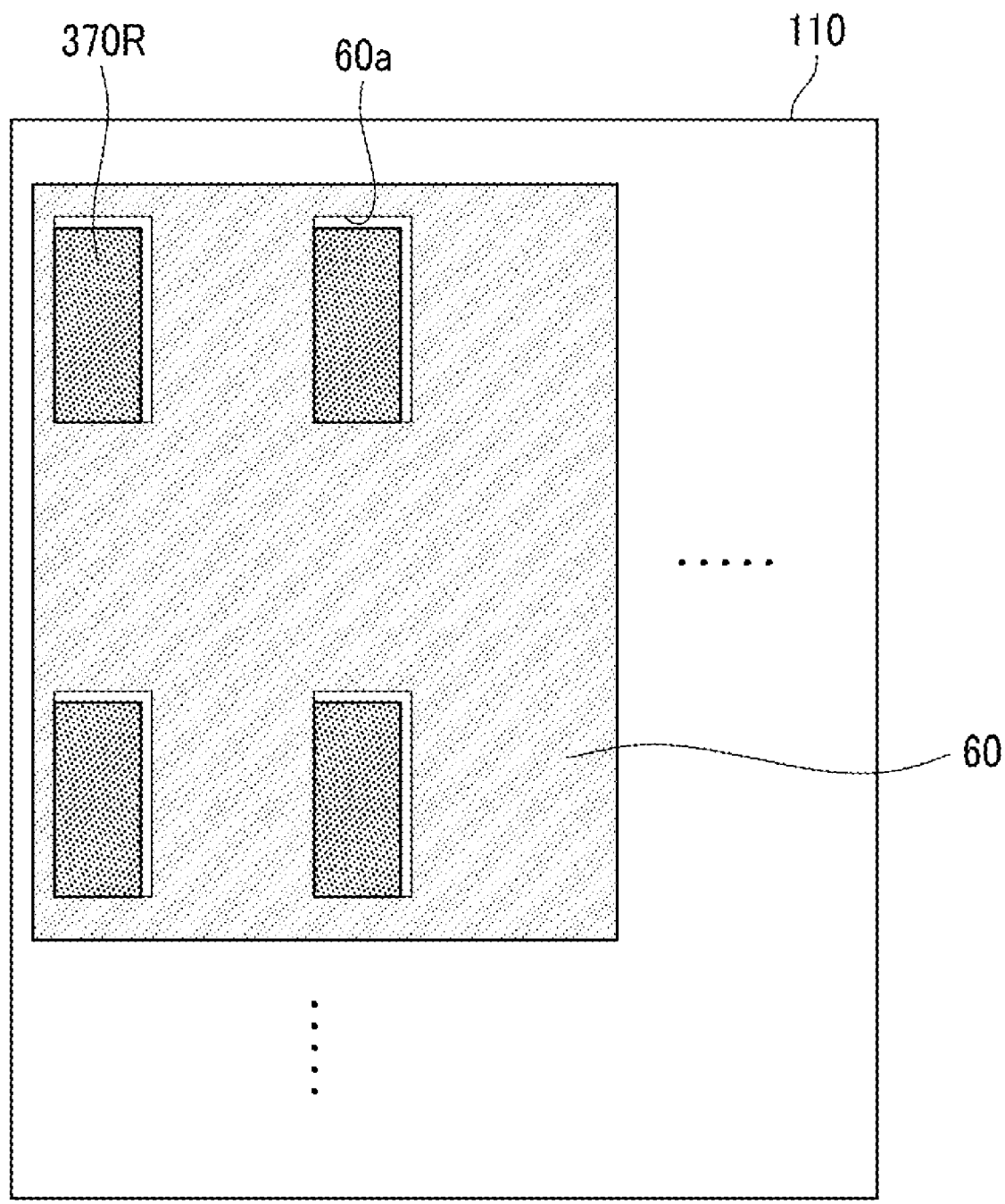
FIG. 17A, FIG. 17B, and FIG. 17C are schematic diagrams sequentially showing methods for forming the organic emission layer in the manufacturing method of the organic light emitting device shown in FIG. 14 and FIG. 15 according to another exemplary embodiment of the present invention.
Figure 17B:
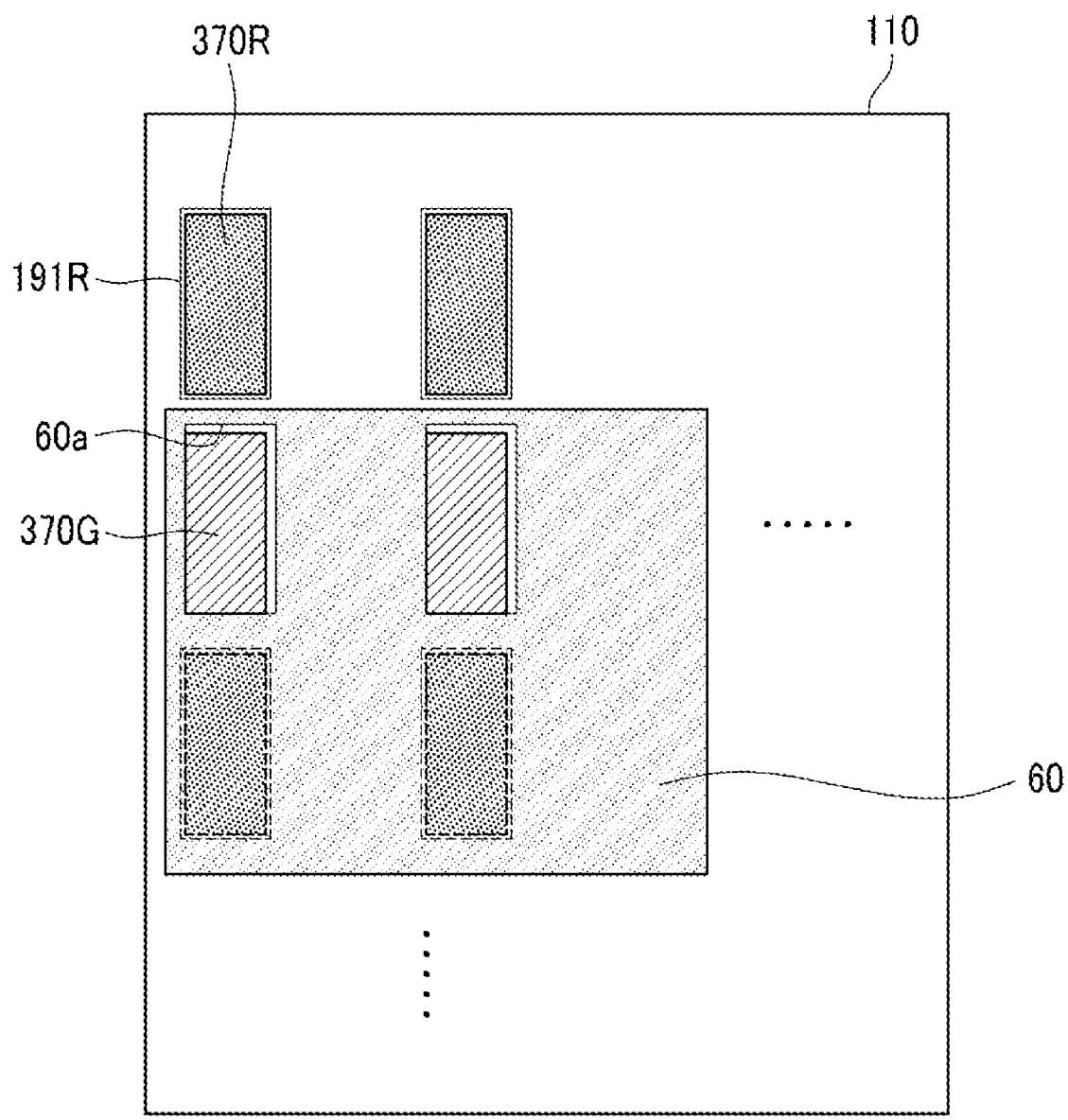
Figure 17C:
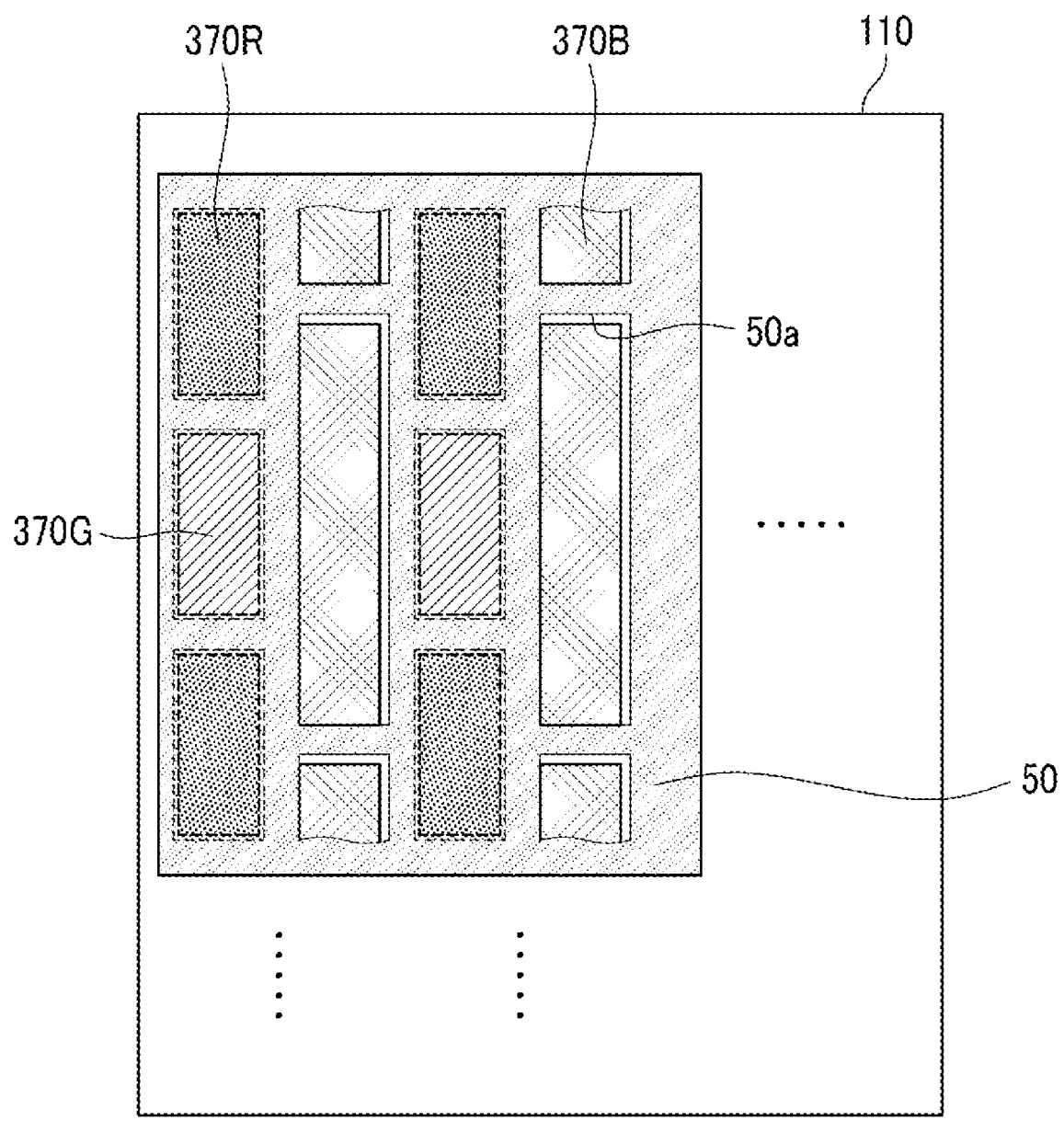

FIG. 16A and FIG. 16B are schematic diagrams showing a mask for forming an organic emission layer in a manufacturing method of an organic light emitting device according to the current exemplary embodiment of the present invention, and FIG. 17A, FIG. 17B, and FIG. 17C are schematic diagrams sequentially showing methods for forming the organic emission layer in the manufacturing method of the organic light emitting device shown in FIG. 14 and FIG. 15.

First, referring to FIG. 15, a plurality of pixel electrodes 191R1, 191R2, 191G1, 191G2, 191B1, and 191B2 are formed on an insulation substrate 110, and an insulating layer 361 is deposited thereon. Here, the insulating layer 361 has a plurality of openings 365 exposing the pixel electrodes 191R1, 191R2, 191G1, 191G2, 191B1, and 191B2.

Next, emission layers 370R, 370G, and 370B are formed in respective openings 365. The emission layers 370R, 370G, and 370B may be formed through a deposition method using a shadow mask.

Referring to FIG. 16A and FIG. 16B, in an exemplary embodiment of the present invention, two masks 60 and 50 are used to deposit the organic emission layers 370R, 370G, and 370B. As shown in FIG. 16A, the sixth mask 60 includes a plurality of openings 60a having an approximately rectangular shape, and it is used to deposit the red emission layers 370R and the green emission layers 370G, and as shown in FIG. 16B, the fifth mask 50 includes a plurality of openings 50a having an approximately rectangular shape, and it is used to deposit the blue emission layer 370B.

Referring to FIG. 14 and FIG. 17A, the sixth mask 60 is disposed on the substrate 110 including the pixel electrodes 191R1, 191R2, 191G1, 191G2, 191B1, and 191B2, and the insulating layer 361. Next, a red emission material is deposited through the openings 60a of the sixth mask 60 to form a plurality of red emission layers 370R on the pixel electrodes 191R1 and 191R2. The red emission layers 370R overlap two pixel electrodes 191R1 and 191R2.

Next, referring to FIG. 17B, the sixth mask 60 is moved a predetermined distance on the substrate 110, and a green emission material is deposited through the openings 60a of the sixth mask 60 to form a plurality of green emission layers 370G on the pixel electrodes 191G1 and 191G2. The green emission layers 370G overlap two pixel electrodes 191G1 and 191G2.

Next, referring to FIG. 17C, the fifth mask 50 is disposed on the substrate 110, and a blue emission material is deposited through the openings 50a of the fifth mask 50 to form a plurality of blue emission layers 370B on the pixel electrodes 191B1 and 191B2. The blue emission layers 370B overlap two pixel electrodes 191B1 and 191B2.

In this exemplary embodiment of the present invention, the red emission layer 370R and the green emission layer 370G of two neighboring red and green pixels, respectively, are formed in one pattern, as is the blue emission layer 370B. Accordingly, reduction of the emission area by manufacturing limits of a shadow mask may be prevented for the red pixel R and the green pixel G, as in blue pixel B, such that the emission area and the aperture ratio may be increased in the red pixel R and the green pixel G.

[Fourth Embodiment]

An organic light emitting device according to another exemplary embodiment of the present invention will be described in detail with reference to FIG. 18.

Figure 18:
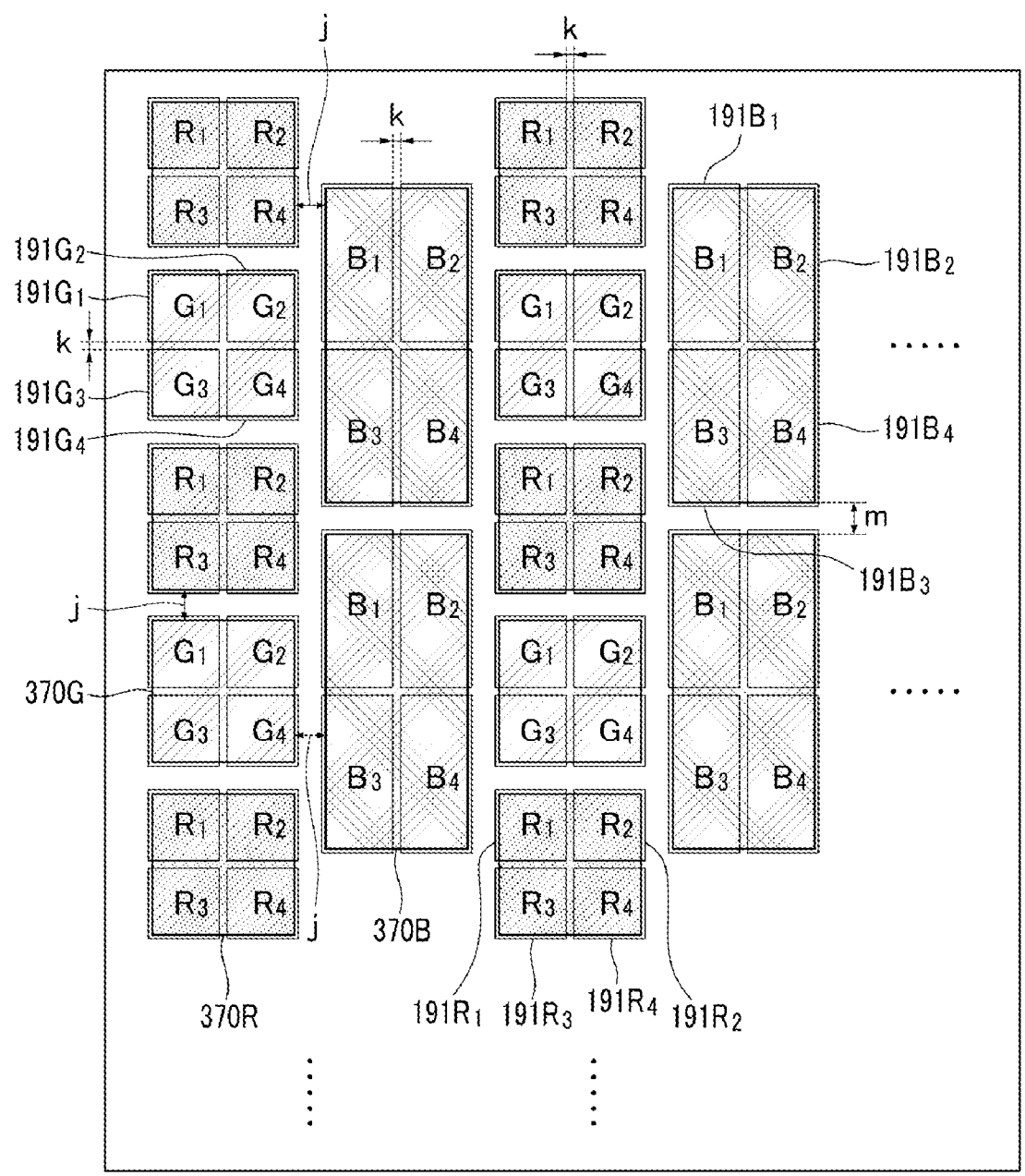
FIG. 18 is a top plan view schematically showing the arrangement of a plurality of pixels in an organic light emitting device according to another exemplary embodiment of the present invention.

FIG. 18 is a top plan view schematically showing the arrangement of a plurality of pixels in an organic light emitting device according to another exemplary embodiment of the present invention.

Referring to FIG. 18, the red pixels R and the green pixels G are repeatedly arranged by twos in a first column, as in the third embodiment, and the blue pixels B are continuously arranged in the second column.

Differently from the third embodiment, the red pixels R and the blue pixels B are repeatedly arranged by twos in a row, and the green pixels G and the blue pixels B are repeatedly arranged by twos in a row.

According to the pixel arrangement, four red pixels R, four blue pixels B, and four green pixels G respectively form groups such that the blue emission layer 370B of four neighboring blue pixels B1, B2, B3, and B4 is formed of one pattern, the red emission layer 370R of four neighboring red pixels R1, R2, R3, and R4 is formed of one pattern, and the green emission layer 370G of four neighboring green pixels G1, G2, G3, and G4 is formed of one pattern.

Here, the interval j between the red pixel group including four red pixels R and the green pixel group including four green pixels G, the interval j between the red pixel group and the blue pixel group including four blue pixels B, and the interval j between the green pixel group and the blue pixel group are substantially the same. The interval m between two neighboring blue pixel groups is larger than the interval j between the red pixel group and the green pixel group.

In this exemplary embodiment, one emission layer is formed in four neighboring pixels such that a shadow mask having an opening with a size corresponding to the sum of the emission areas of the four neighboring pixels may be used when forming the emission layer. The deposition method using the shadow mask is the same as that of the previous exemplary embodiment, so a description thereof is omitted.

The emission layer of four neighboring blue pixels is formed of one pattern such that they are connected without an interval therebetween, and the interval between neighboring pixels is substantially determined by the interval k between the pixel electrodes. This holds for the red pixel group, the green pixel group, and the blue pixel group.

The interval k between the pixel electrode 191R1 and the pixel electrode 191R2 or the pixel electrode 191G1 and the pixel electrode 191G2 is unrelated to the shadow mask used to deposit the emission layer 370R and 370G such that the shadow effect, in which the emission area is reduced by the limits of the shadow mask, may be prevented. Also, the emission layer of four neighboring blue pixels is formed of one pattern such that the emission area may be further obtained, compared with the above-described embodiment.

[Fifth Embodiment]

An organic light emitting device according to another exemplary embodiment of the present invention will be described in detail below with reference to FIG. 19.

Figure 19:
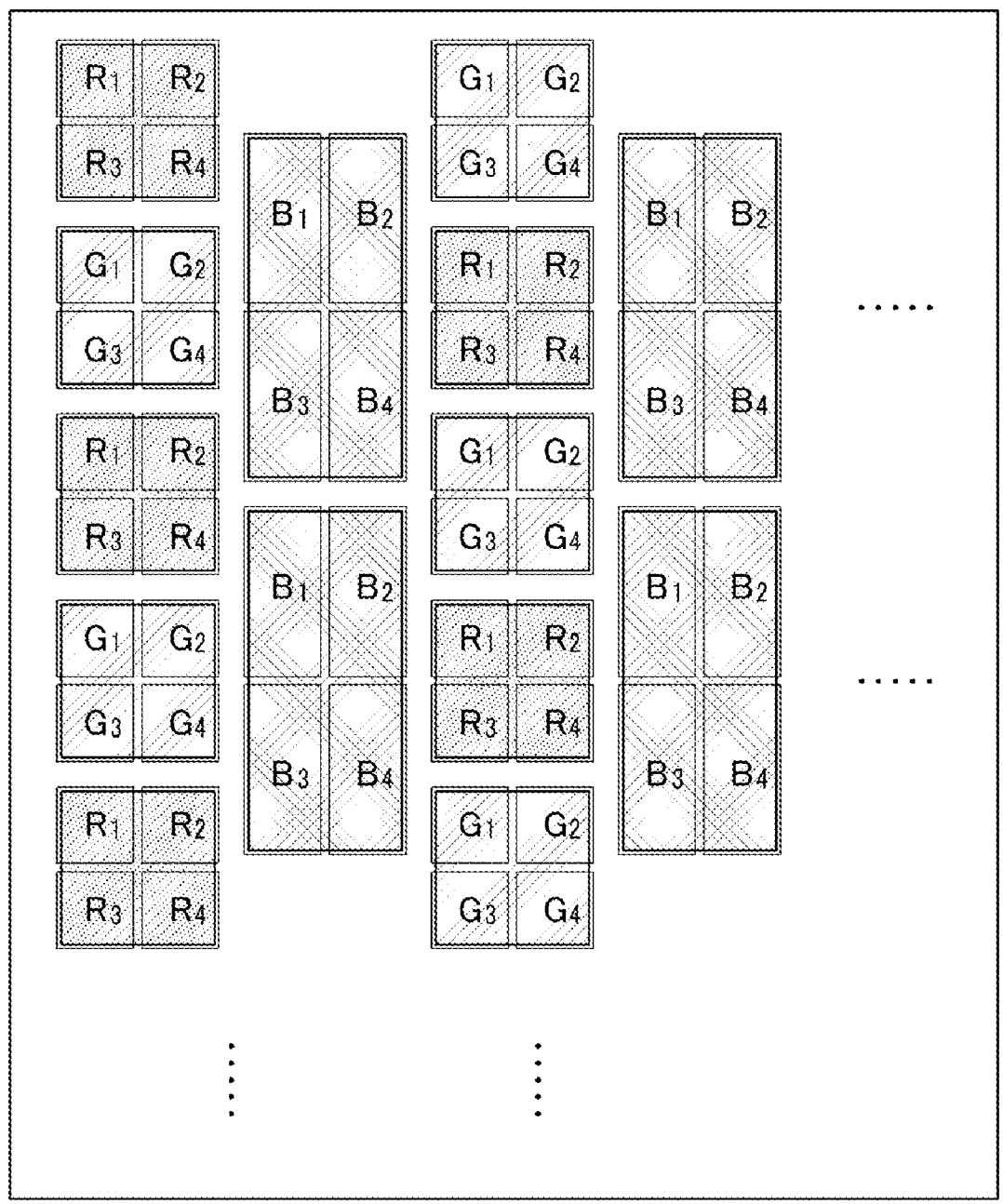
FIG. 19 is a top plan view schematically showing the arrangement of a plurality of pixels in an organic light emitting device according to another exemplary embodiment of the present invention.

FIG. 19 is a top plan view schematically showing the arrangement of a plurality of pixels in an organic light emitting device according to another exemplary embodiment of the present invention.

Referring to FIG. 19, the red pixels R and the green pixels G are repeatedly arranged by twos in the first column, as in the fourth embodiment, and the blue pixels B are continuously arranged in the second column.

Differently from the fourth embodiment, two red pixels R, two blue pixels B, and two green pixels G are repeatedly arranged in a row. In this case, the aperture ratio is the same as in the fourth embodiment, but the visibility may be improved.

In the above-described exemplary embodiment of FIG. 18, pixels of two kinds, for example the red pixels R and the blue pixels B, or the green pixels G and the blue pixels B, are repeatedly arranged according to the row. However, in the exemplary embodiment of FIG. 19, three pixels, for example the red pixels R, the blue pixels B, and the green pixels G are repeatedly arranged in a row such that horizontal stripes that may be generated according to the row when displaying a spatial color, such as with the red pixel R and the green pixel G, may be prevented. Accordingly, the pixel arrangement according this exemplary embodiment may improve the visibility compared with the above-described embodiment.

Next, an improvement of the aperture ratio of the organic light emitting device according to the exemplary embodiments of the present invention will be described below with reference to FIG. 20.

Figure 20:
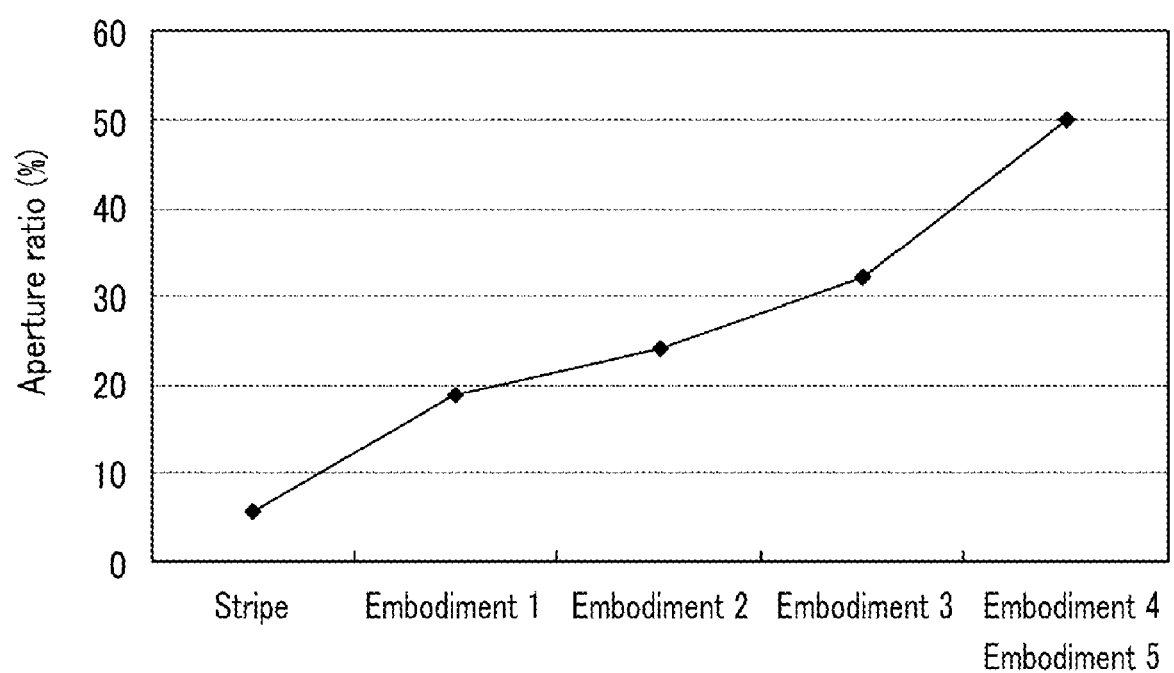
FIG. 20 is a graph showing the aperture ratios of the organic light emitting device according to an exemplary embodiment of the present invention, and the organic light emitting device of the stripe structure.

FIG. 20 is a graph showing the aperture ratios of the organic light emitting devices according to the exemplary embodiments of the present invention, as well as the organic light emitting device of the conventional stripe structure.

Referring to FIG. 20, the aperture ratios of the organic light emitting devices according to the first to fifth exemplary embodiments are improved compared with the organic light emitting device of the stripe structure.

Accordingly, in the organic light emitting devices according to the exemplary embodiments of the present invention, the shadow effect, in which the emission area is reduced by the limits of the shadow mask, may be prevented such that the reduction of the emission area and the aperture ratio may be prevented in large-sized organic light emitting devices.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting device, comprising:
a plurality of first pixels comprising a first pixel electrode and an emission layer disposed on the first pixel electrode, the first pixels to display a first color;
a plurality of second pixels comprising a second pixel electrode and an emission layer disposed on the second pixel electrode, the second pixels to display a second color; and
a plurality of third pixels comprising a third pixel electrode and an emission layer disposed on the third pixel electrode, the third pixels to display a third color,
wherein the first pixels and the second pixels are arranged in a first column, the third pixels are arranged in a second column, and the emission layer of the third pixels overlaps at least two third pixel electrodes,
wherein an interval between neighboring third pixels in the second column is larger than an interval between neighboring first and second pixels in the first column, and
wherein an area of the third pixel is larger than an area of each of the first pixel and the second pixel.

2. The organic light emitting device of claim 1, wherein an interval between neighboring first and the second pixels is substantially the same as an interval between neighboring first and third pixels, and an interval between neighboring second and third pixels.

3. The organic light emitting device of claim 2, wherein one first pixel and one second pixel are alternately arranged in the first column.

4. The organic light emitting device of claim 2, wherein two first pixels and two second pixels are alternately arranged in the first column.

5. The organic light emitting device of claim 4, wherein the emission layer of the first pixels overlaps at least two first pixel electrodes neighboring each other.

6. The organic light emitting device of claim 5, wherein the emission layer of the second pixels overlaps at least two second pixel electrodes neighboring each other.

7. The organic light emitting device of claim 2, wherein the first color is red, the second color is green, and the third color is blue.

8. An organic light emitting device, comprising:
a plurality of first pixels comprising an emission layer to display a first color;
a plurality of second pixels comprising an emission layer to display a second color; and
a plurality of third pixels comprising an emission layer to display a third color,
wherein the first pixels and the second pixels are arranged in a first column, the third pixels are arranged in a second column, and the emission layers of at least two third pixels are connected to each other,
wherein an interval between neighboring third pixels in the second column is larger than an interval between neighboring first and second pixels in the first column, and
wherein an area of the third pixel is larger than an area of each of the first pixel and the second pixel.

9. The organic light emitting device of claim 8, wherein the first color is red, the second color is green, and the third color is blue.

10. The organic light emitting device of claim 9, wherein the emission layers of at least two first pixels are connected to each other.

11. The organic light emitting device of claim 10, wherein the emission layers of at least two second pixels are connected to each other.

12. The organic light emitting device of claim 9, wherein an interval between neighboring first and the second pixels is substantially the same as an interval between neighboring first and third pixels, and an interval between neighboring second and third pixels.

13. An organic light emitting device, comprising:
a plurality of red pixel groups, each red pixel group being arranged in a 2×2 matrix of four red pixels sharing one red emission layer;
a plurality of green pixel groups, each green pixel group being arranged in a 2×2 matrix of four green pixels sharing one green emission layer; and
a plurality of blue pixel groups, each blue pixel group being arranged in a 2×2 matrix of four blue pixels sharing one blue emission layer,
wherein the red pixel groups and the green pixel groups are alternately arranged in a first column, the blue pixel groups are continuously arranged in a second column, and the first column and the second column are alternately arranged.

14. The organic light emitting device of claim 13, wherein an arrangement of the red pixel groups and the green pixel groups of the first column disposed on a first side of the second column is the same as an arrangement of the red pixel groups and the green pixel groups of the first column disposed on a second side of the second column.

15. The organic light emitting device of claim 13, wherein a red pixel group is a top-most pixel group of the alternately arranged red pixel groups and green pixel groups of the first column that is disposed on a first side of the second column, and a green pixel group is the top-most pixel group of the alternately arranged red pixel groups and green pixel groups of the first column that is disposed on a second side of the second column.

16. An organic light emitting device, comprising
a plurality of first pixels, a plurality of second pixels, and a plurality of third pixels to display different colors,
wherein the first pixels and the second pixels are arranged in a first column,
the third pixels are arranged in a second column,
an interval between neighboring third pixels is larger than an interval between neighboring first and second pixels, and an area of the third pixel is larger than an area of each of the first pixel and the second pixel.

17. The organic light emitting device of claim 16, wherein the first pixels and the third pixels, or the second pixels and the third pixels, are alternately arranged in a row.

18. The organic light emitting device of claim 17, wherein neither the first pixels, the second pixels, nor the third pixels include portions that are continuously arranged according to a row or column.

19. The organic light emitting device of claim 18, wherein the interval between neighboring first and second pixels is substantially the same as an interval between neighboring first and third pixels, or an interval between neighboring second and third pixels.

20. The organic light emitting device of claim 16, wherein the first pixels display red, the second pixels display green, and the third pixels display blue.

* * * * *